United States Patent [19]

Motohara et al.

[11] Patent Number: 5,305,328
[45] Date of Patent: Apr. 19, 1994

[54] METHOD OF TEST SEQUENCE GENERATION

[75] Inventors: Akira Motohara, Hyogo; Toshinori Hosokawa; Mitsuyasu Ohta, both of Osaka, all of Japan

[73] Assignee: Matsushita Electric Industrial Co., Ltd., Kadoma, Japan

[21] Appl. No.: 602,405

[22] Filed: Oct. 22, 1990

[30] Foreign Application Priority Data

Oct. 24, 1989 [JP] Japan .................................. 1-277404

[51] Int. Cl.$^5$ ............................................ G06F 11/00
[52] U.S. Cl. ...................................... 371/27; 371/23; 371/22.1
[58] Field of Search ................ 371/27, 23, 22.1, 61, 371/62, 57.1, 62

[56] References Cited

U.S. PATENT DOCUMENTS

| | | | |
|---|---|---|---|
| 4,833,395 | 5/1989 | Sasaki et al. | 324/73 R |
| 4,903,267 | 2/1990 | Arai | 371/27 |
| 4,996,689 | 2/1991 | Samad | 371/22.2 |

OTHER PUBLICATIONS

Essential: An efficient self-learning test-Pattern Generation Algorithm for Sequential Circuits by Michael H. Schulz; Elisabeth Auth; 1989 IEEE pp. 28-37.
Smart & Fast: Test Generation for VLSI Scan-Design Circuits by M. Abramovici; J. J. Kulikowski; P. R. Menon; & D. T. Miller Aug. 1986 IEEE pp. 43-54.
Controllability/Observability Analysis of Digital Circuits by Lawrence H. Goldstein 1979 IEEE pp. 685-693.

Primary Examiner—Robert W. Beausoliel, Jr.
Assistant Examiner—Ly V. Hua
Attorney, Agent, or Firm—Ratner & Prestia

[57] ABSTRACT

An efficient method of generating test sequences for sequential circuits is disclosed. This method generates a test sequence for a combinational circuit which includes an object fault, examines memory elements where a resulting state (other than "don't care") has been set as a result of the fault. This is followed by fault propagation and state justification. In the event that, due to such factors as limitations in computing time, generation of test sequence was aborted during fault propagation or state justification, the states of the memory elements are provided for determining which memory element should be scanned to detect the fault. In another embodiment an assumed fault from previous processing has been propagated to a memory element and, thus, to a pseudo primary input terminal. The results of the previous processing are used to propagate the fault to a primary output terminal or to another memory element and, thus, to another pseudo primary output terminal. Other embodiments of the invention generate tests according to degrees of difficulty in generating a fault of a particular type along various signal paths in the circuit. These include faults propagated to the control input terminals of memory elements. A final embodiment of the invention determines, as a result of prior processing, values which should be set for a tree circuit input in order to set the tree circuit output to a 0 or a 1. Then, during test generation, when selecting the signal line and the signal to be set, the tree data is used to expedite the selection and processing of signal line and value assignments.

9 Claims, 22 Drawing Sheets

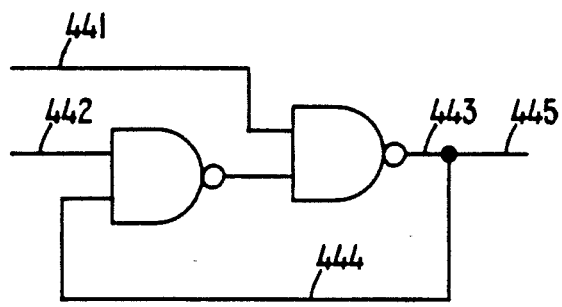
FIG. 4e
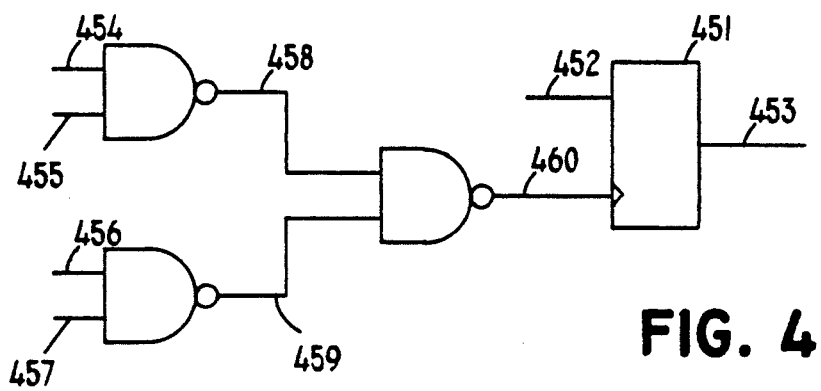
FIG. 4f
| | CO | CI | CP | CN |
|---|---|---|---|---|
| 454 | 5 | 10 | 15 | 15 |
| 455 | 5 | 8 | 13 | 13 |
| 456 | 6 | 8 | 14 | 14 |
| 457 | 5 | 8 | 15 | 15 |
| 458 | 18 | 5 | 23 | 23 |
| 459 | 16 | 5 | 22 | 22 |
| 460 | 10 | 15 | 27 | 27 |
FIG. 4g

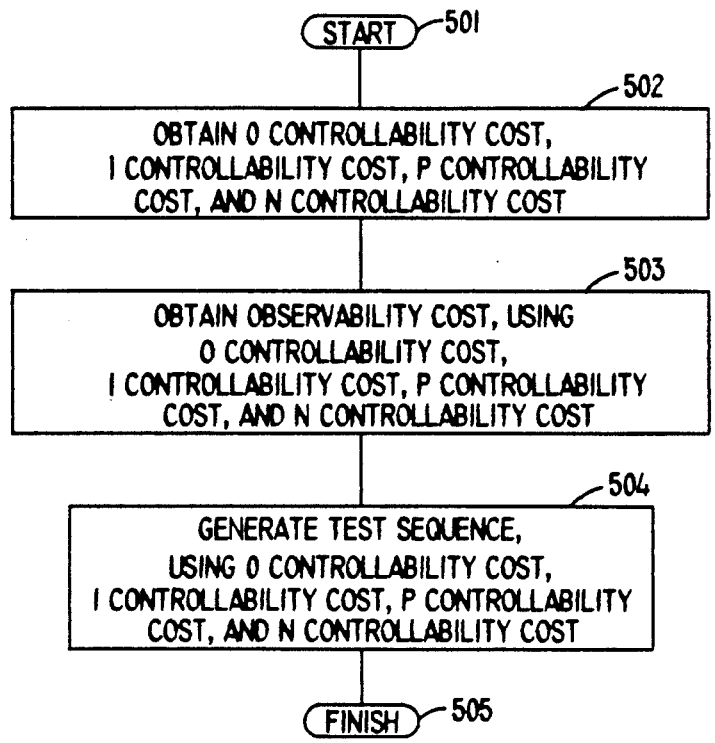
FIG. 5a
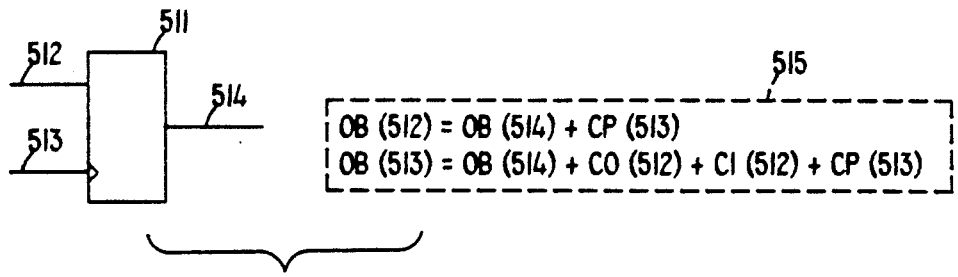
FIG. 5b
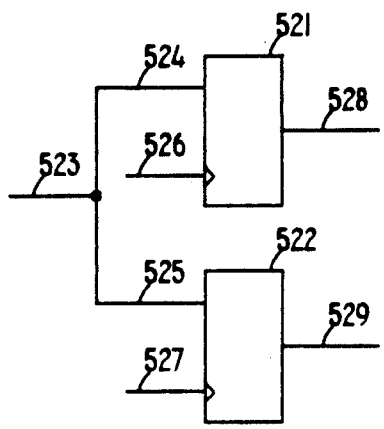
FIG. 5c
| | CO | CI | CP | CN | OB |
|---|---|---|---|---|---|
| 523 | 0 | 0 | 0 | 0 | 7 |
| 524 | 0 | 0 | 0 | 0 | 8 |
| 525 | 0 | 0 | 0 | 0 | 7 |
| 526 | 3 | 4 | 8 | 8 | 8 |
| 527 | 2 | 5 | 7 | 7 | 7 |
| 528 | 8 | 8 | 17 | 17 | 0 |
| 529 | 7 | 7 | 15 | 15 | 0 |
FIG. 5d

METHOD OF TEST SEQUENCE GENERATION

BACKGROUND OF INVENTION

The subject invention relates to a method of generating test sequences for digital circuits.

Prior art methods of test sequence generation are described in *FAULT TOLERANT COMPUTING Theory and Techniques*, Volume 1, Chapter 1, 1.4.2 "Stuck at Fault Testing," published by Prentice-Hall, Englewood, N.J.; and M. H. Schulz and E. Auth: "ESSENTIAL": An Effective Self-Learning Test Pattern Generation Algorithm for Sequential Circuits, Proc. *Int. Test Conf.*, pp. 28-37, August 1989; and their referenced documents.

We shall now explain, utilizing the figures, the prior art in the test sequence generation method with which the subject invention is concerned.

The prior art relating to test sequence methods for sequential circuits includes such methods as the iterative array method as shown in FIG. 9; the method of state justification after determining the fault propagation path, shown in FIG. 10; and, a method of simultaneously determining the fault propagation path and state justification in reverse direction to the time axis.

FIG. 9 is a conceptual figure of a sequential circuit which is transformed into an iterative array. One cell of this array is called a time frame.

In FIG. 9, 901 represents time frame 0, 911 represents time frame 1 and 921 represents time frame i. In time frame 0, 902 represents the combinational circuit, 903 represents the memory elements, and 904, 905, 906 and 907 represent, respectively, the primary inputs, pseudo primary inputs, primary outputs and pseudo primary outputs. In time frame 1, 912 represents the combinational circuit, 913 represents the memory elements, and 914, 915, 916 and 917 represent, respectively, the primary inputs, pseudo primary inputs, primary outputs, and, pseudo primary outputs. 922 represents the combinational circuit in time frame i, 923 represents the memory elements, and 924, 925, 926 and 927, respectively, represent the primary inputs, pseudo primary inputs, primary outputs and pseudo primary outputs.

In the iterative array method, by replacing a temporal expansion with a spatial expansion in the circuit under consideration, the circuit under consideration is entirely represented by combinational logic. In the circuit, the target fault is handled as multiple fault and, the test pattern generation algorithm for the combinational logic is applied in the iterative array.

As shown by the flow chart diagram in FIG. 10, the method of state justification after determining the fault propagation path, consists of commencing processing at step 1001. The fault propagation path is determined at step 1002 on the basis of testability costs. Then at step 1003, the greatest time frame's unjustified signal line is justified. At step 1004, a determination is made as to whether there are unjustified signal lines, and if there are unjustified signal lines, the time axis is followed in a reverse direction at step 1005, and processing returns to step 1003. If there are no unjustified signal lines, processing advances to step 1006 and the test sequence generation is terminated.

As shown by the flow chart in FIG. 11, the method of simultaneously determining the fault propagation path and undertaking state justification in reverse sequence to the time axis, starts processing at step 1102. If the fault propagation path is not complete, a path is sought from the location of the fault or from the pseudo primary input to the primary output. Alteratively, a path is sought to the pseudo primary output which corresponds to the flip-flop located at the pseudo primary input at the next time frame which is equivalent to the fault signal. Also, a value is allocated to the pseudo primary output which corresponds to the flip-flop which is equivalent to the pseudo primary input at the next time frame, where unjustified signal lines will exist. These unjustified signal lines will then have their state justified.

In the event that test sequence generation had not been completed at the time of the test at step 1103, the processing proceeds to step 1104, the time frame is replaced by the next time frame, and processing reverts to step 1102. If the test sequence had been generated at the time of test at step 1103, the process branches to step 1105 and test sequence generation is completed.

However, the prior art methods have the following problems:

(1) If sufficient fault coverage is not obtained as a result of test sequence generation, it will be necessary to modify the design itself to facilitate testing. In particular, if a partial scan design is to be adopted, it is vital to determine which memory element will be scanned in order to detect the large number of faults which were undetected by the result of test sequence generation. However, in the prior art methods, it is difficult in the process of test sequence generation to obtain data to indicate which memory element should be scanned if processing was aborted due to computing time limitation, etc.

For example, in the iterative array method, since a plurality of time frames are simultaneously processed in the iterative array, unjustified signal lines and fault effects are scattered over time frames at that point in time when processing was aborted. Thus, it is difficult to immediately obtain data which is useful for selecting the memory elements which should be scanned.

In the method which justifies the state after determining the fault propagation path, and in the method of simultaneously determining the fault propagation path and justifying the state in reverse direction to the time axis, there are times when the fault propagation path from the point of fault to the primary output has not been justified at the time when processing was aborted. In such case, data useful for the selection of memory elements which should be scanned cannot be obtained.

(2) A large amount of time is required for fault propagation processing. The difficulty of selecting a path where fault propagation is easy, and, the sensitization of fault propagation paths for each and every fault can be cited as reasons why time is required for fault propagation processing.

For example, in the iterative array method, at each gate in the iterative array, the propagation of fault signals takes place by forward processing. If the path selection was unsuitable, backtracking takes place in accordance with the allocation of values made at each and every gate with consequent use of computation time.

In the method which undertakes state justification after determining the fault propagation path, if the initial path selection was unsuitable, many backtracks will be necessary in attempting to sensitize paths which are difficult to sensitize. Thus, the time for test sequence generation becomes extremely long. In these methods, as well as in the method of simultaneously undertaking the determination of the fault propagation path and state justification in reverse direction of the time axis, it is necessary to select the fault propagation path or to carry out fault propagation operations for each and every fault. They both require large amounts of computing time.

(3) There is no measurement to accurately represent the difficulty of generating the rise and fall signals. In the prior art methods, when using the heuristic technique, there is no measurement for testability which directly reflects the degree of difficulty in generating rise and fall in relation to the clocking operation.

Since the difficulties in controlling to 0 and in controlling to 1 were used to represent the difficulties of the rise and fall operations, efficiency was sometimes poor. For instance, in a dual input exclusive OR, it is easy to create rise and fall operations for one input, it is then easy to generate rise or fall signals at the output regardless of whether the other value is 0 or 1. Yet, according to the prior art computation methods, the difficulty of generating the output's rise or fall signal was represented by the difficulty in generating 0 for the output and 1 for the output. Thus, it was treated as being difficult even when it was actually easy to generate rise and fall signals. Therefore, there were times when effort was expended in assigning rise and fall signals to other signal lines in cases where it was difficult to generate rise and fall signals. At these times, the efficiency of test input generation was degraded.

(4) It is difficult to deal with fault signals entering the memory element's control input. At such time as when the fault propagation path includes a path from the control input of the memory element through the output of the memory element, differences have to be created at the control input of the memory element by the existence or the non-existence of the rise or fall signals. In addition, fault propagation is undertaken to transmit the existence or the non-existence of a fault to the output. At such times, the amount of required memory is increased since it is necessary to consider a plurality of time frames simultaneously. Hence, the efficiency of test sequence generation is decreased because a plurality of time frames must be managed.

(5) It is difficult to handle reconvergent clock signals. In the prior art methods, if the clock signal is branched and reconverged after passing through a varying number of time frames, it may be difficult to make the iterative array itself. Or, even if the iterative array is made, backtracking which spans time frames may take place due to demand inconsistencies, so that the efficiency of test sequence generation is decreased. For example, in the iterative array method, if there are memory elements in the reconvergence path, there are times when the number of time frames in the reconvergence path do not match. In these situations, it is difficult to make an iterative array model.

In the method of conducting state justification after determining the fault propagation path, and in the method of simultaneously determining the fault propagation path and justifying the state in reverse direction of the time axis, the processing assumes state allocation will be done independently. This assumption is made despite the fact that, actually, the status of the lines on a reconvergent path are mutually dependent. Therefore, inconsistencies are generated at the reconvergent point, decreasing the efficiency of test sequence generation.

(6) Computing time is required for state justification. In the prior art methods, it was necessary to perform state justification for test sequence generation for every fault. Thus, large amounts of computing time were required.

SUMMARY OF THE INVENTION

The subject invention was conceived, taking these factors into consideration, with the object of presenting a very efficient method of generating test sequences.

In order to achieve this objective, the embodiment in claim 1 is characterized by: generating a test sequence for the combinational circuit which includes the object fault, examining the memory element where the resulting state (other than "don't care") has been set and the memory element to which the effects of the fault has reached, followed by fault propagation and state justification. In the event that, due to such factors as limitations in computing time, generation of test sequence was aborted during fault propagation or state justification, the results of the said memory element comparison are outputted and used as material for determining which memory element should be scanned.

In the embodiments of claim 2 and claim 3, the results of test sequence generation for a fault assumed as being at the pseudo primary input are used for test sequence generation of other faults.

The embodiment in claim 2 is characterized by generating test sequences for the combinational circuit for the fault assumed in previous processing to be in the pseudo primary input, and using the results of the said previous processing to propagate to the primary output the fault signal which had reached the pseudo primary output.

An embodiment of claim 3, in addition to claim 2, is characterized by utilizing the results of previous processing to propagate the fault signal, which had reached the pseudo primary output. The pseudo primary output is then capable of propagating the fault signal to a primary output.

In embodiments of claim 4 and claim 5, the testability measure will be used which represents the degree of difficulty in generating the rise and fall signals.

An embodiment of claim 4 is characterized by, in addition to the traditionally used 0 controllability cost and 1 controllability cost, obtaining the cost of generating rise and fall signals for these signal lines from prior processing and using the said cost at the time of generating clock signals during test sequence generation to determine which signal line the clock signal should be allocated to.

An embodiment of claim 5, in addition to claim 4, is characterized by basing the costs of generating rise and fall signals to obtain the cost of observing each signal line's state. These costs are then utilized to select, for example, the fault propagation path, during test sequence generation.

An embodiment of claim 6 is characterized by the fault signal of the memory element's control input being represented by the presence or the non-presence of the rise and fall signals. That is, when the effects of the fault are being propagated to the memory element's control input, values are so allocated that the fault values will be the combination of the rise and fall signals and 0 or 1, or, the reverse thereof.

The embodiment in claim 7 is characterized by obtaining, in prior processing, the time frame when the clock signal would enter the control input of each memory element, and allocating values to the memory elements accordingly. That is to say, when setting up a clock at the memory element's control input, the time frame for establishing the same will be determined in accordance with data obtained in prior processing.

In the embodiment of claim 8, through prior processing, the values which should be set for the tree circuit input in order to set the tree circuit output to a 0 or a 1 is obtained. Then, when selecting the signal line and the signal to be set, by utilizing the said data, the process of selecting the location of values to be allocated is expedited.

FIG. i(b) is a circuit diagram of the circuit under consideration which is the object of test sequence generation in embodiment 1.

Figure 1A:
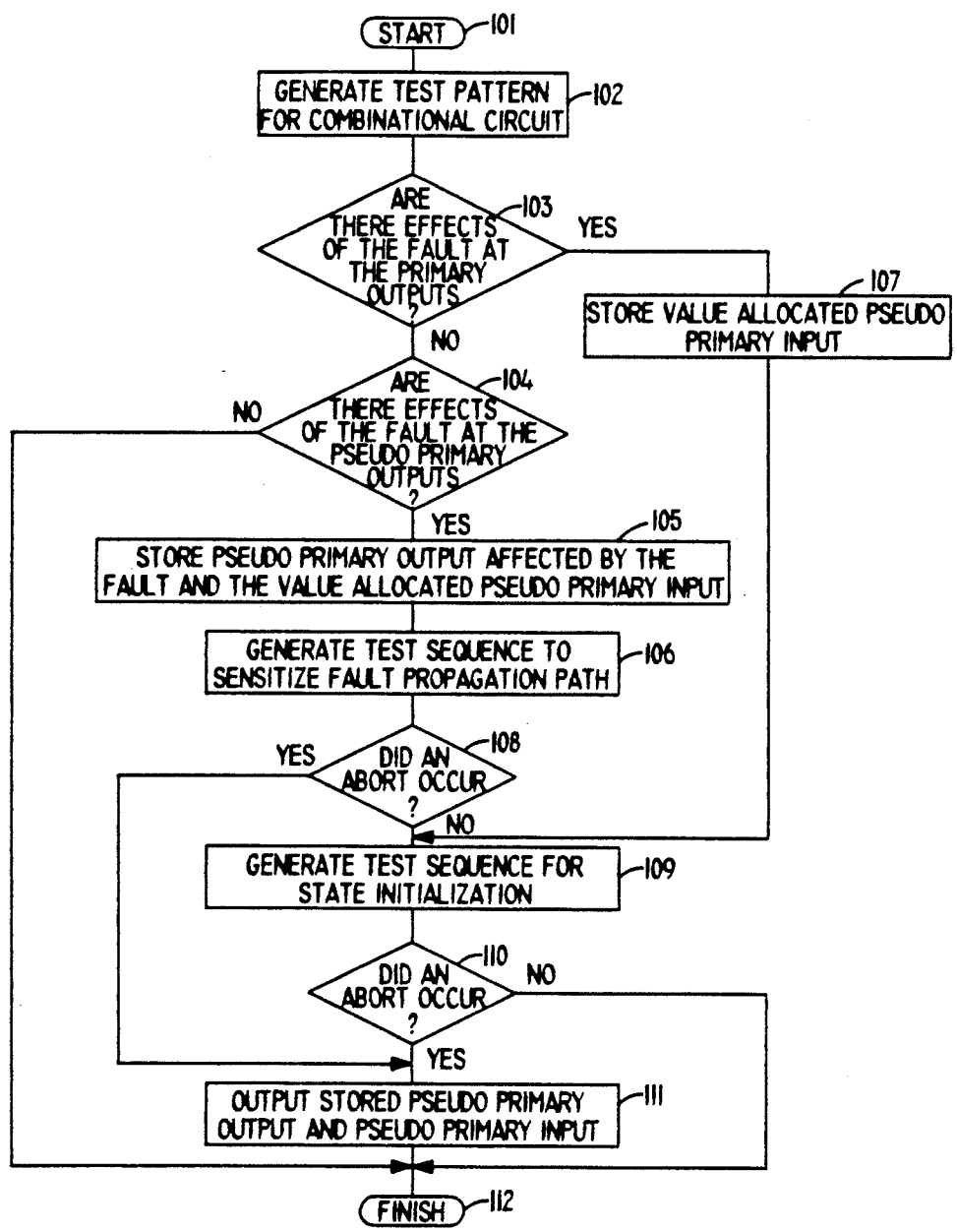
FIG. 1(a) is a flow chart diagram showing the test sequence generation method of embodiment 1.
Figure 1B:
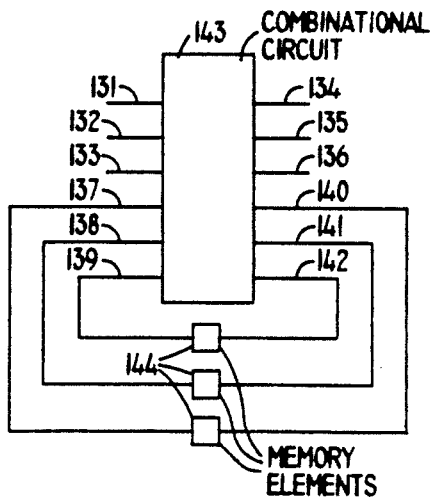
Figure 1C:
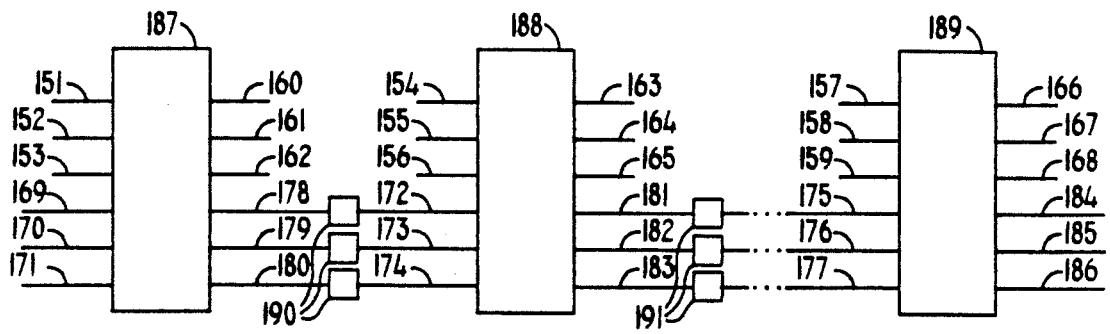
Figure 1D:
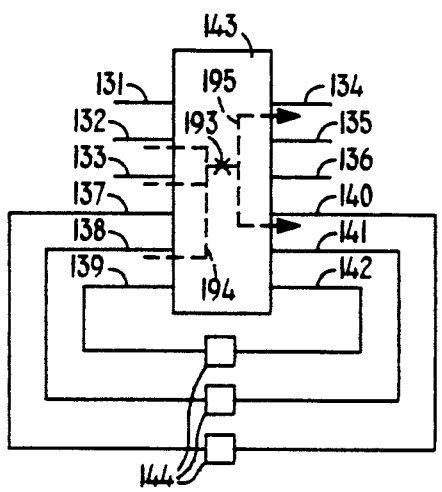
Figure 1E:
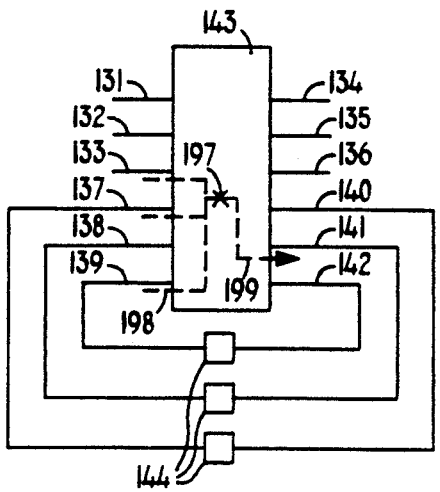

FIG. 1(c) is a conceptual diagram of the said circuit, which for the sake of convenience of explanation, is represented as an iterative array FIG. 1(d) and FIG. 1(e) are circuit diagrams used for explaining the test sequence generation method of embodiment 1.

Figure 2A:
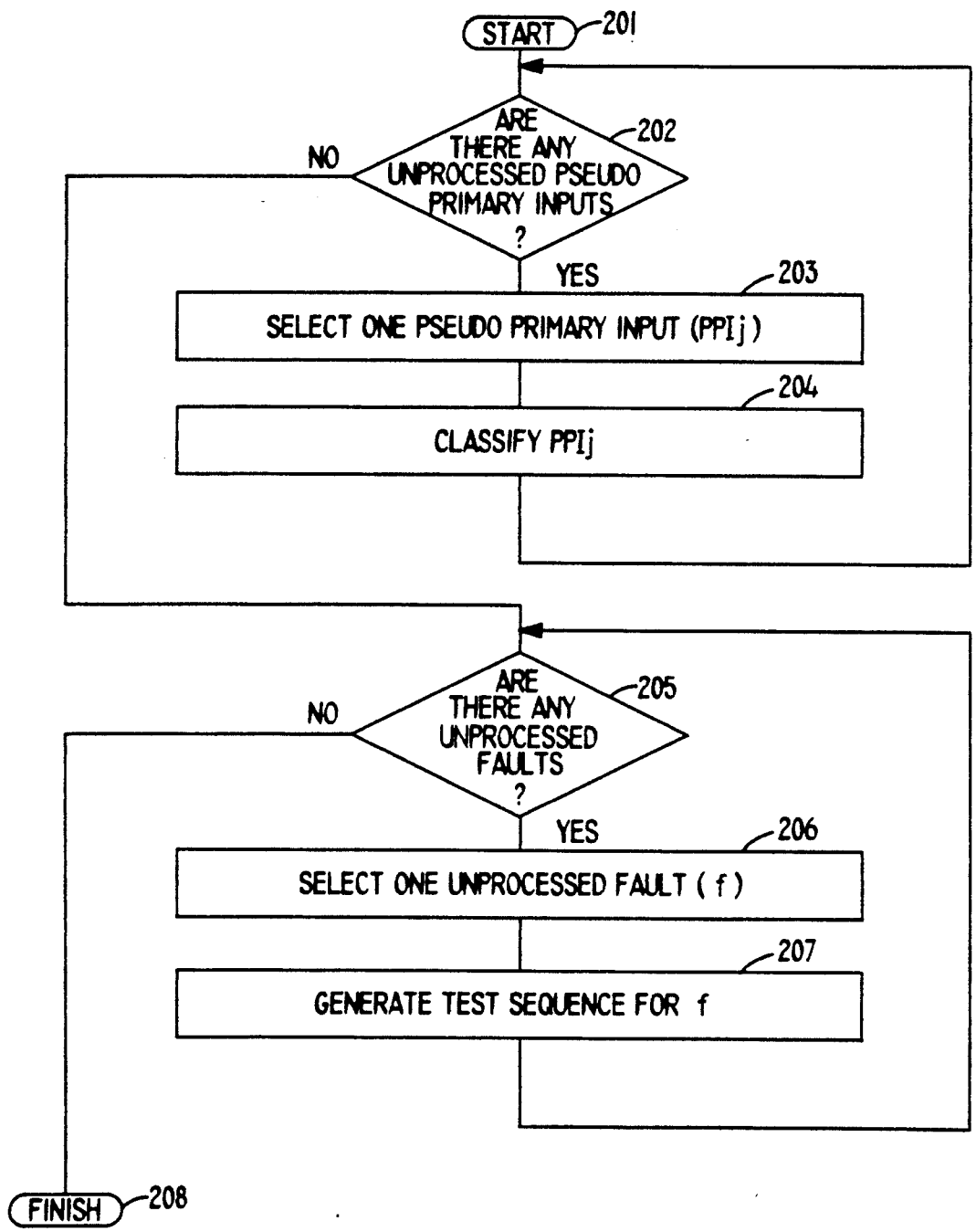
Figure 2B:
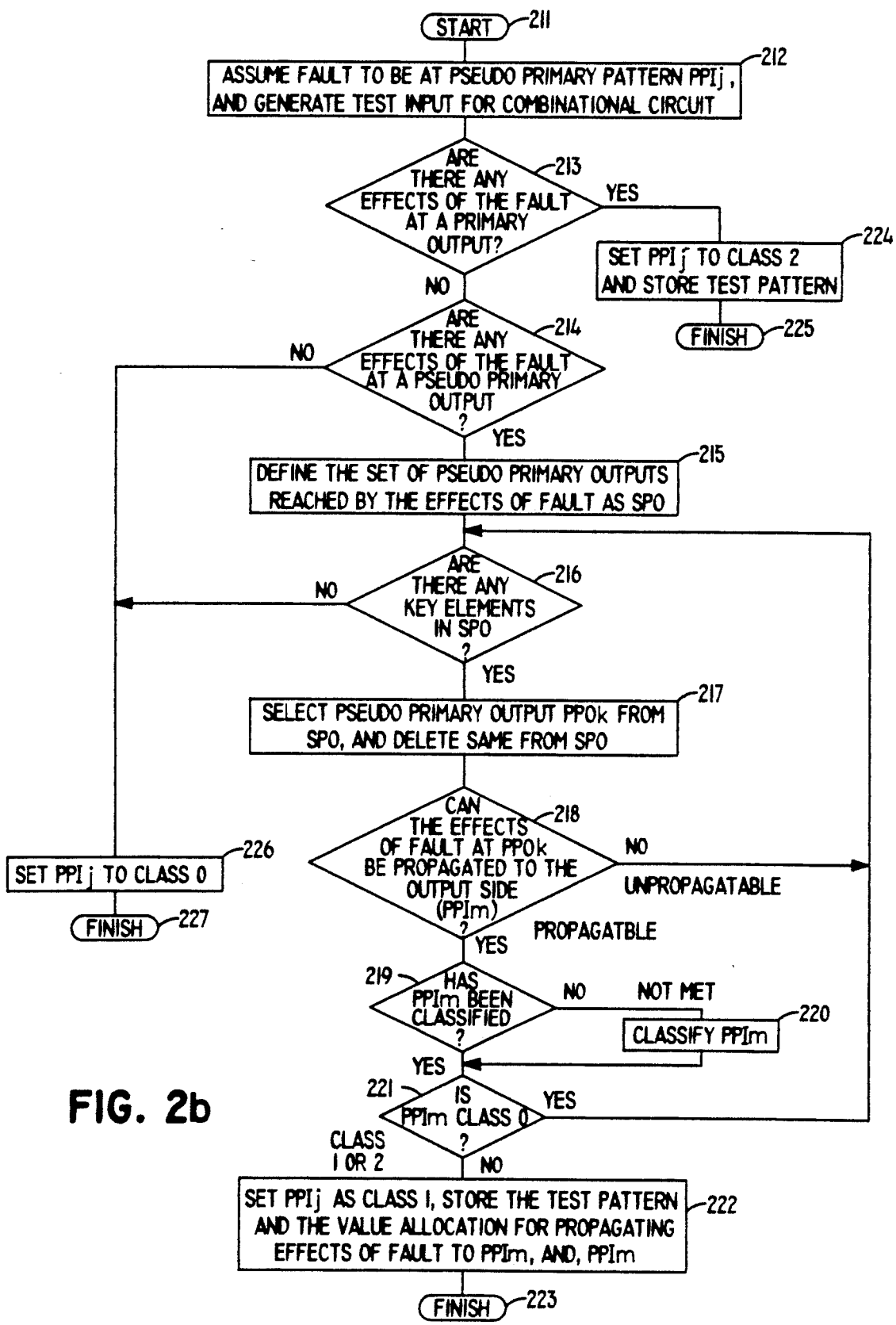
Figure 2C:
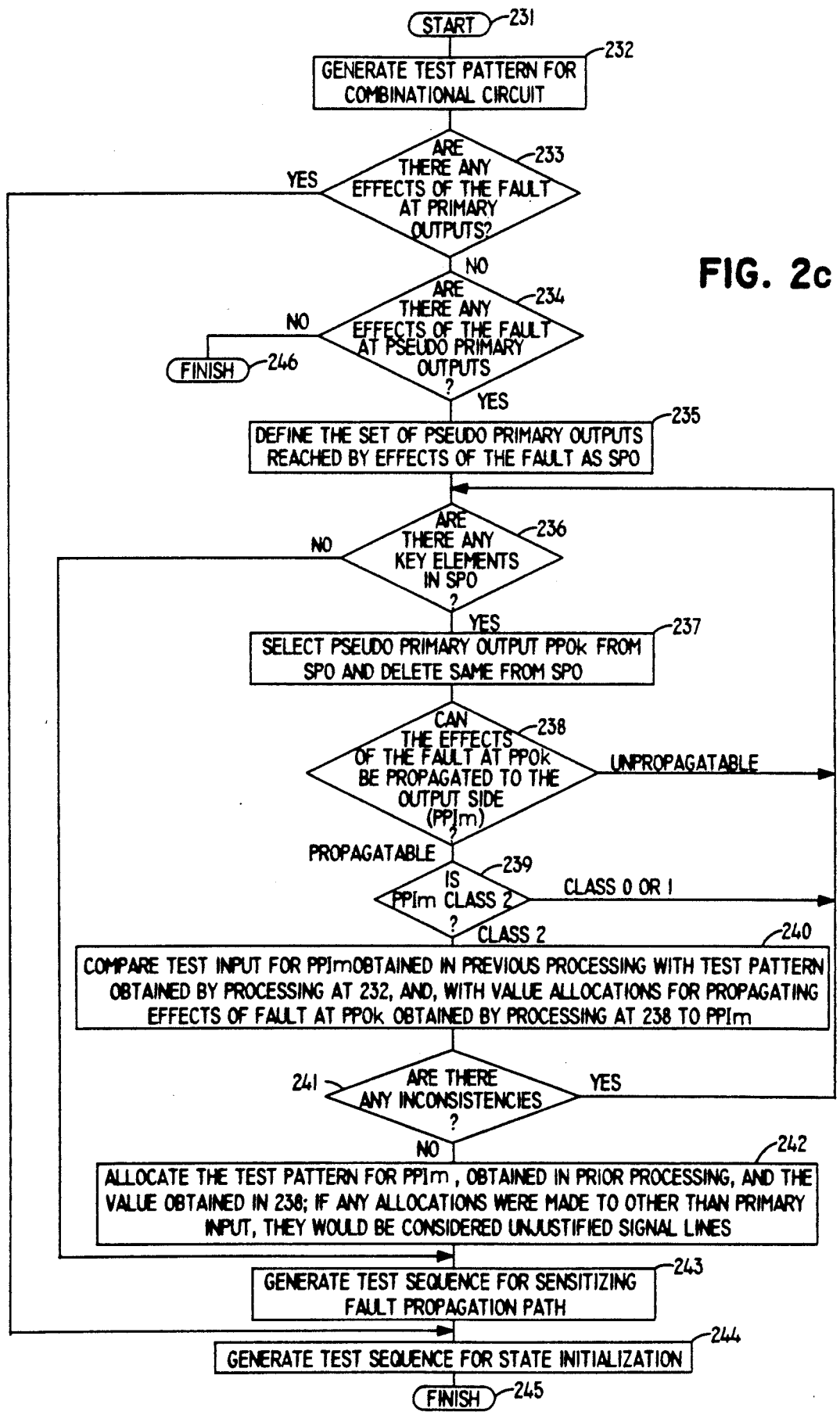

FIGS. 2(a)-(c) are flow chart diagrams showing the test sequence generation method of embodiment 2.

Figure 2D:
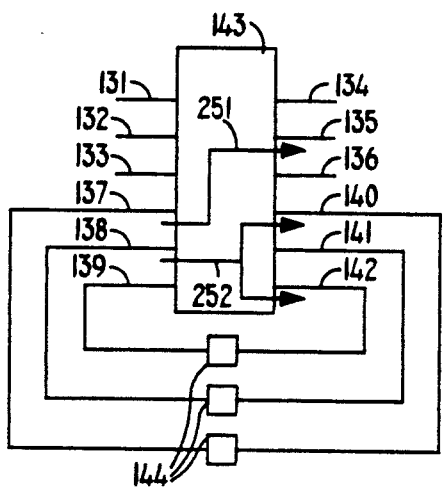

FIG. 2(d) is a circuit diagram used to explain the classification method for the pseudo primary inputs.

Figure 2E:
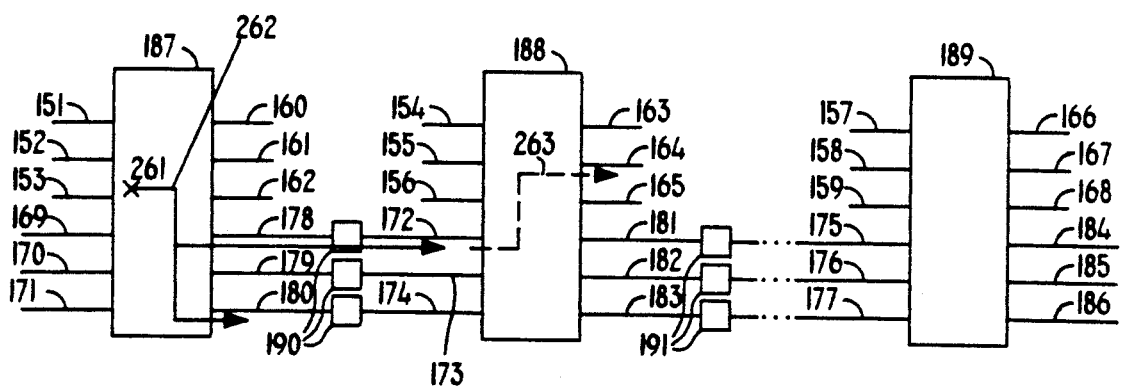

FIG. 2(e) is a circuit diagram used to explain the test sequence generation method of embodiment 2.

Figure 3A:
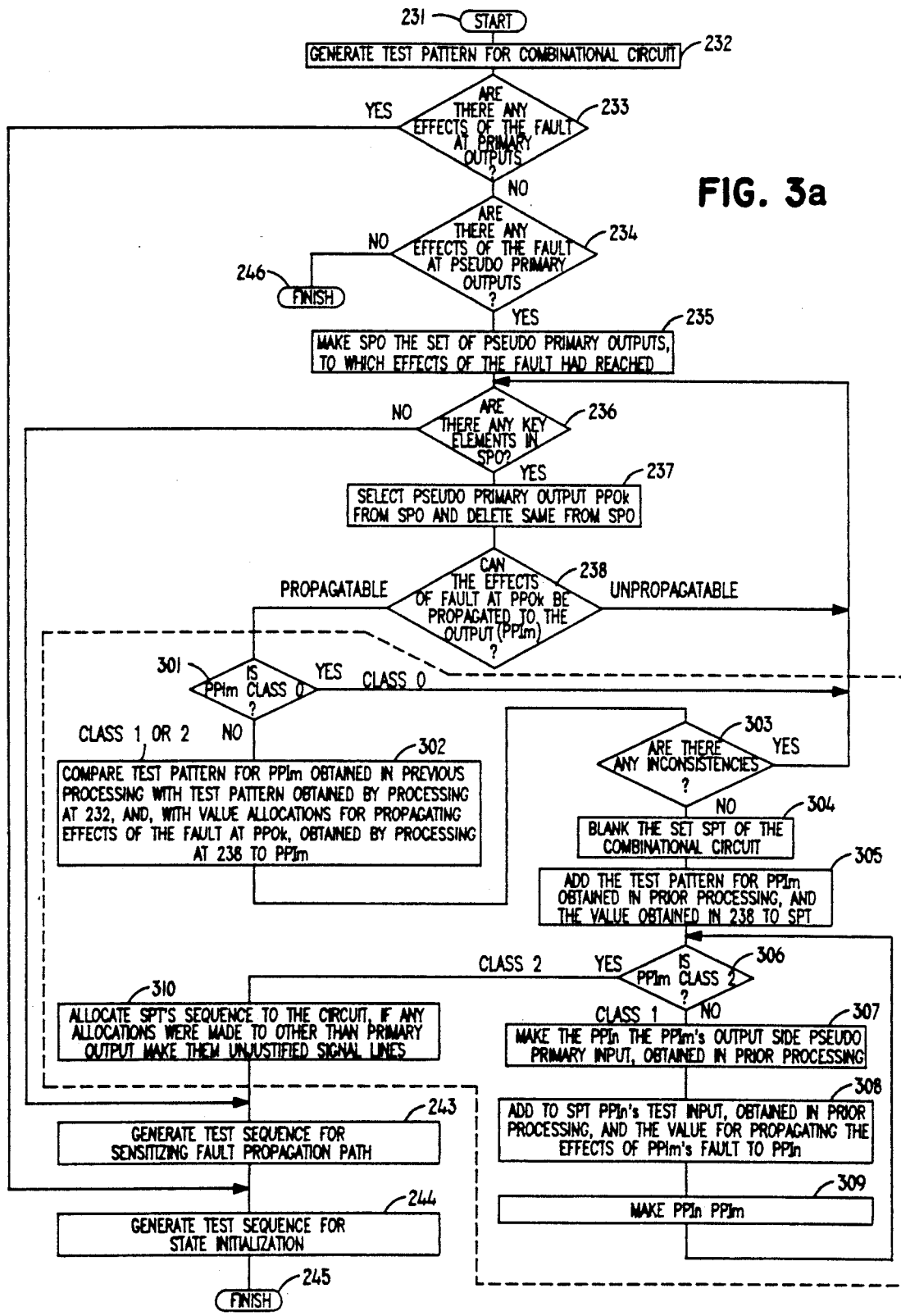

FIG. 3(a) is a flow chart diagram showing the test sequence generation method of embodiment 3.

Figure 3B:
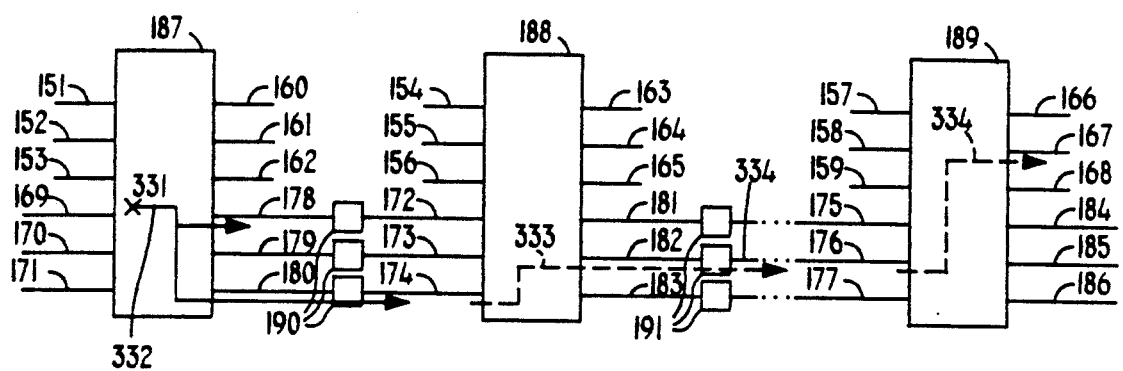

FIG. 3(b) is a circuit diagram used to explain the test sequence generation method of embodiment 3.

Figure 4A:
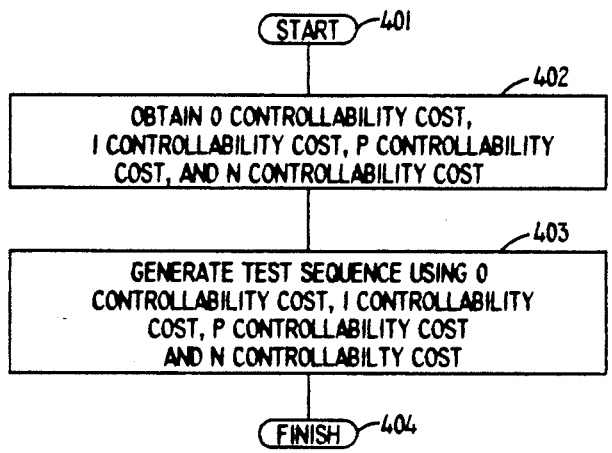

FIG. 4(a) is a flow chart diagram showing the test sequence generation method of embodiment 4.

FIGS. 4(b)-(e) are used to explain the processing at step 402 to obtain the P controllability cost and the N controllability cost.

FIG. 4(f) is a circuit diagram used to explain test sequence generation 403, using the P controllability cost and the N controllability cost.

FIG. 4(g) is a table showing the 0 controllability cost, 1 controllability cost, P controllability cost and the N controllability cost for each signal line of FIG. 4(f).

FIG. 5(a) is a flow chart diagram showing the test sequence generation method of embodiment 5.

FIG. 5(b) is a figure showing the processing at step 503 to obtain the observability cost using the P controllability cost and the N controllability cost.

FIG. 5(c) is a figure explaining the test sequence generation at step 504 utilizing the observability cost calculated by using the P controllability cost and the N controllability cost.

FIG. 5(d) is a figure showing the observability cost, 0 controllability cost, 1 controllability cost, P controllability cost and the N controllability cost for each signal line of FIG. 5(c).

Figure 6A:
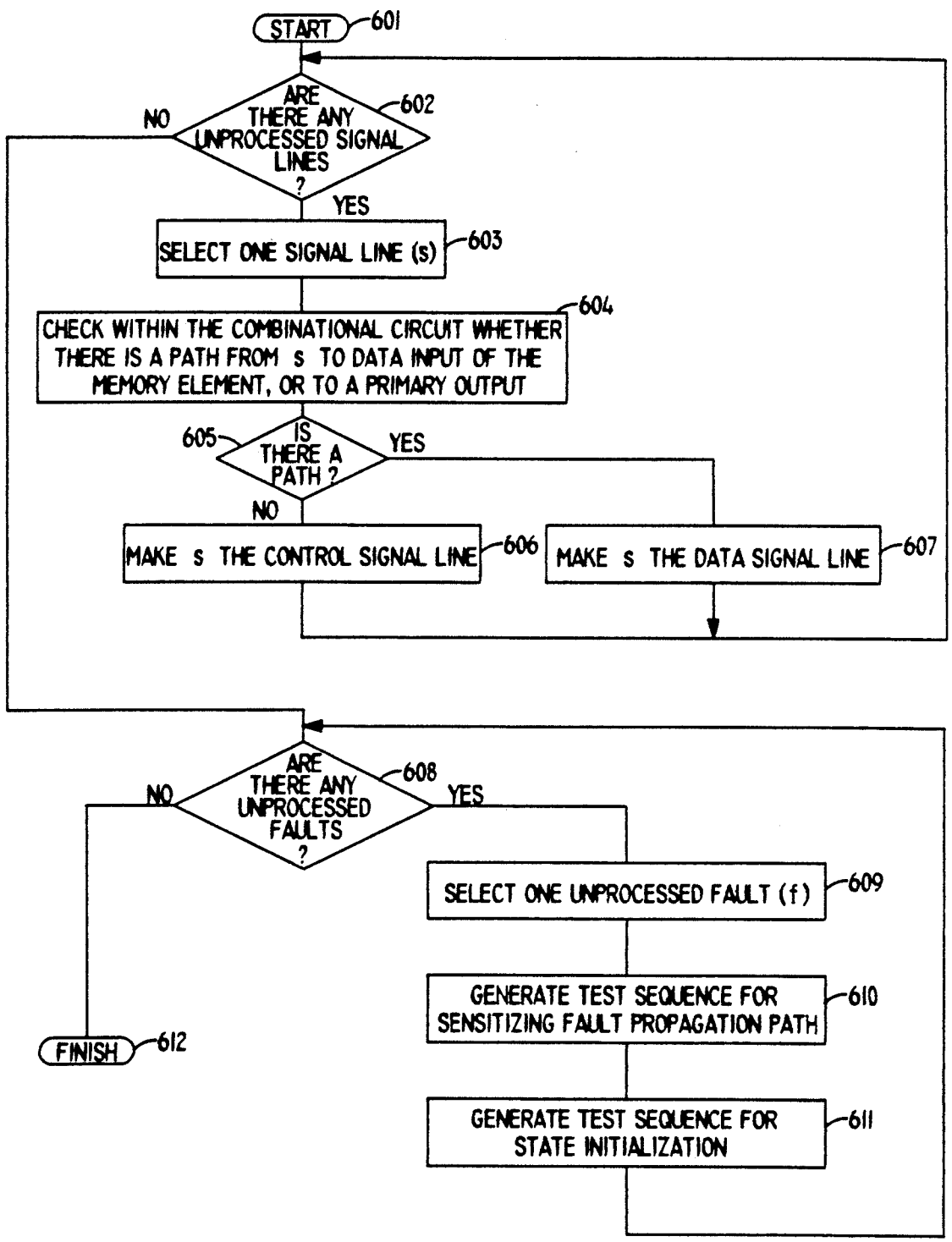

FIG. 6(a), (b) are flow chart diagrams showing the test sequence generation method of embodiment 6.

Figure 6B:
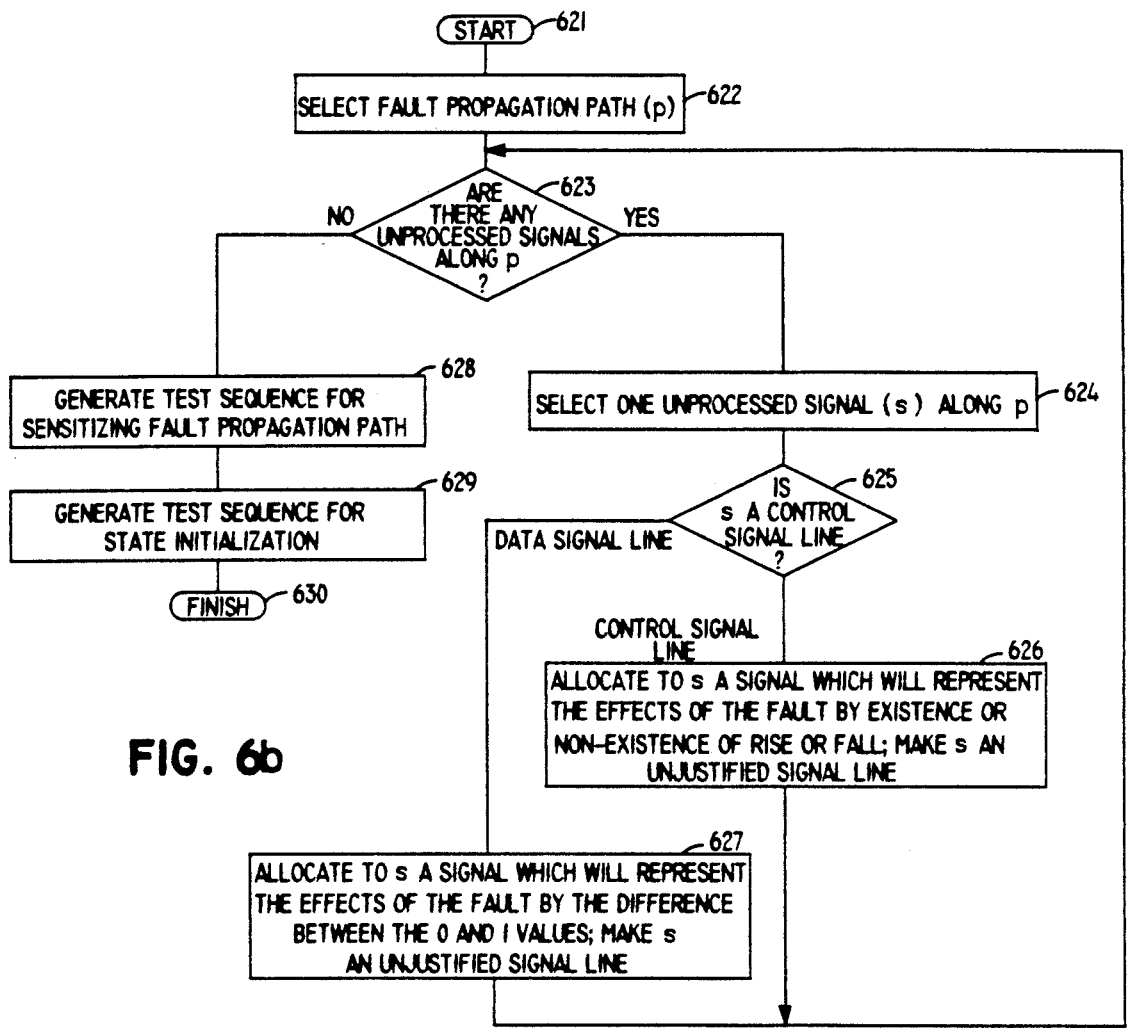
Figure 6C:
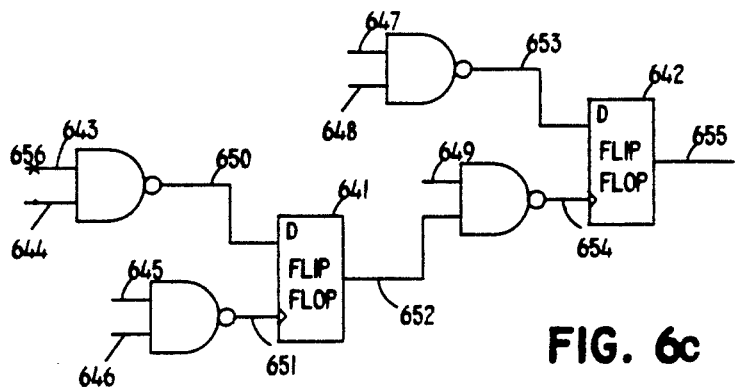

FIG. 6(c) is a circuit diagram used to explain the said method.

Figure 7A:
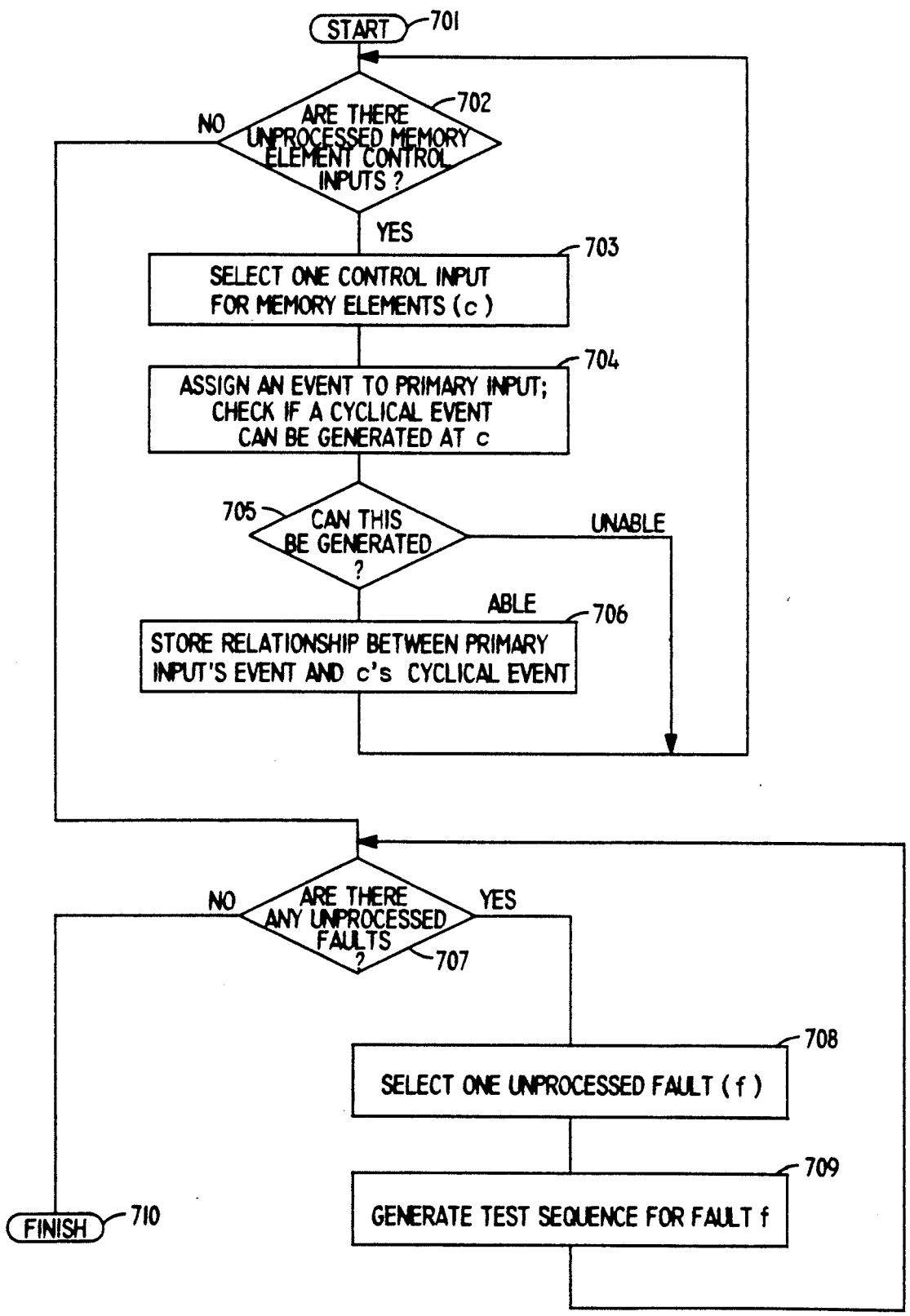

FIGS. 7(a), (b) are flow chart diagrams showing the test sequence generation method of embodiment 7.

Figure 7B:
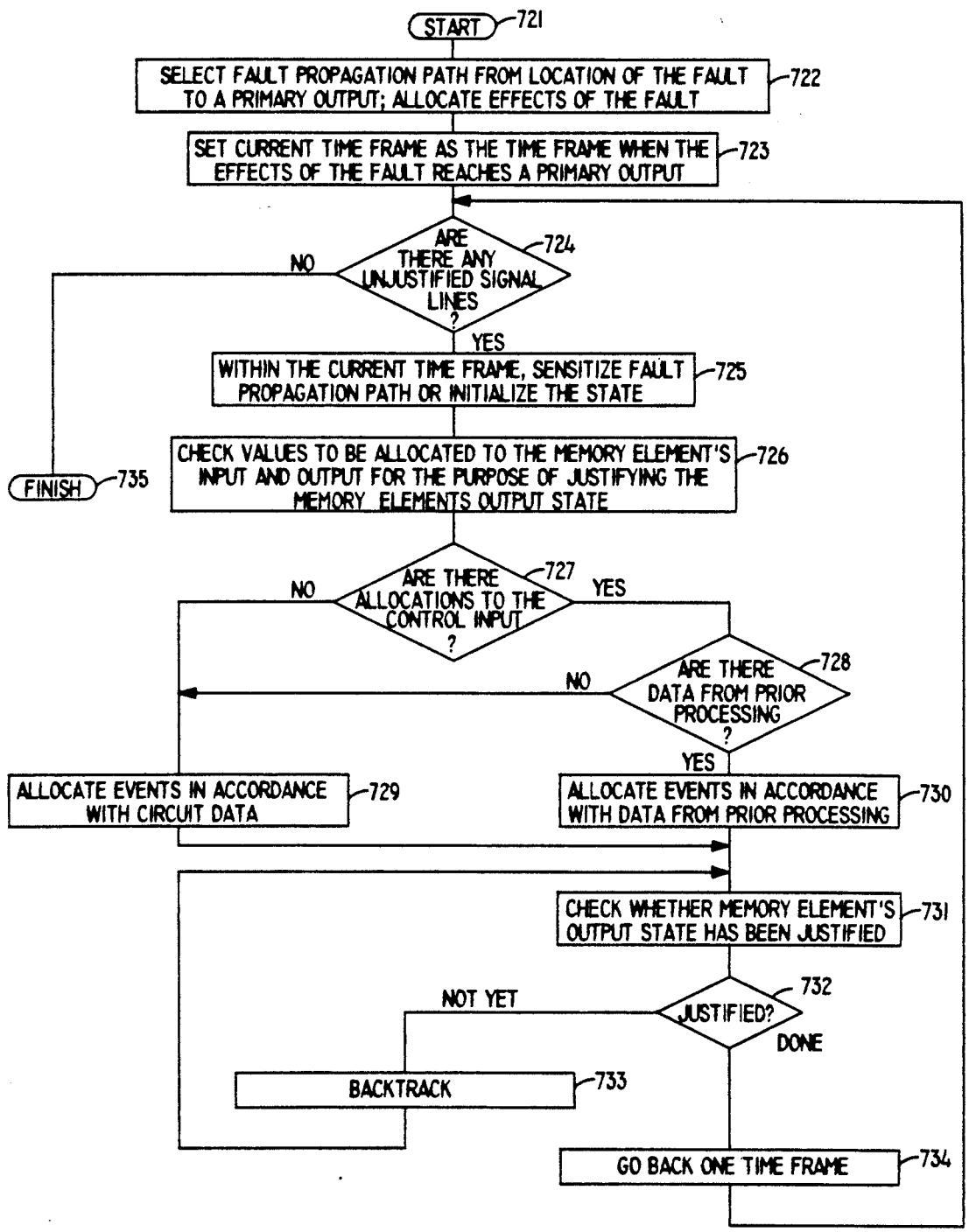
Figure 7C:
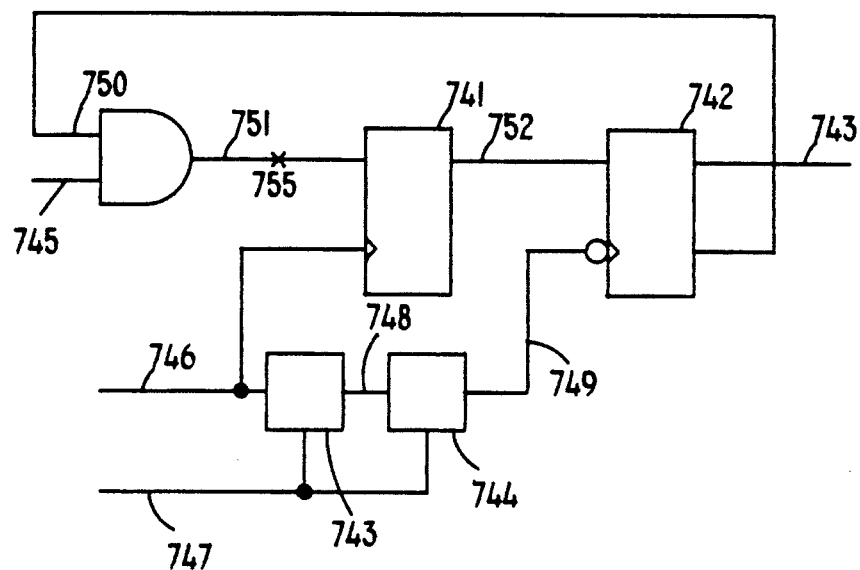

FIG. 7(c) is a circuit diagram used to explain the said method.

Figure 8A:
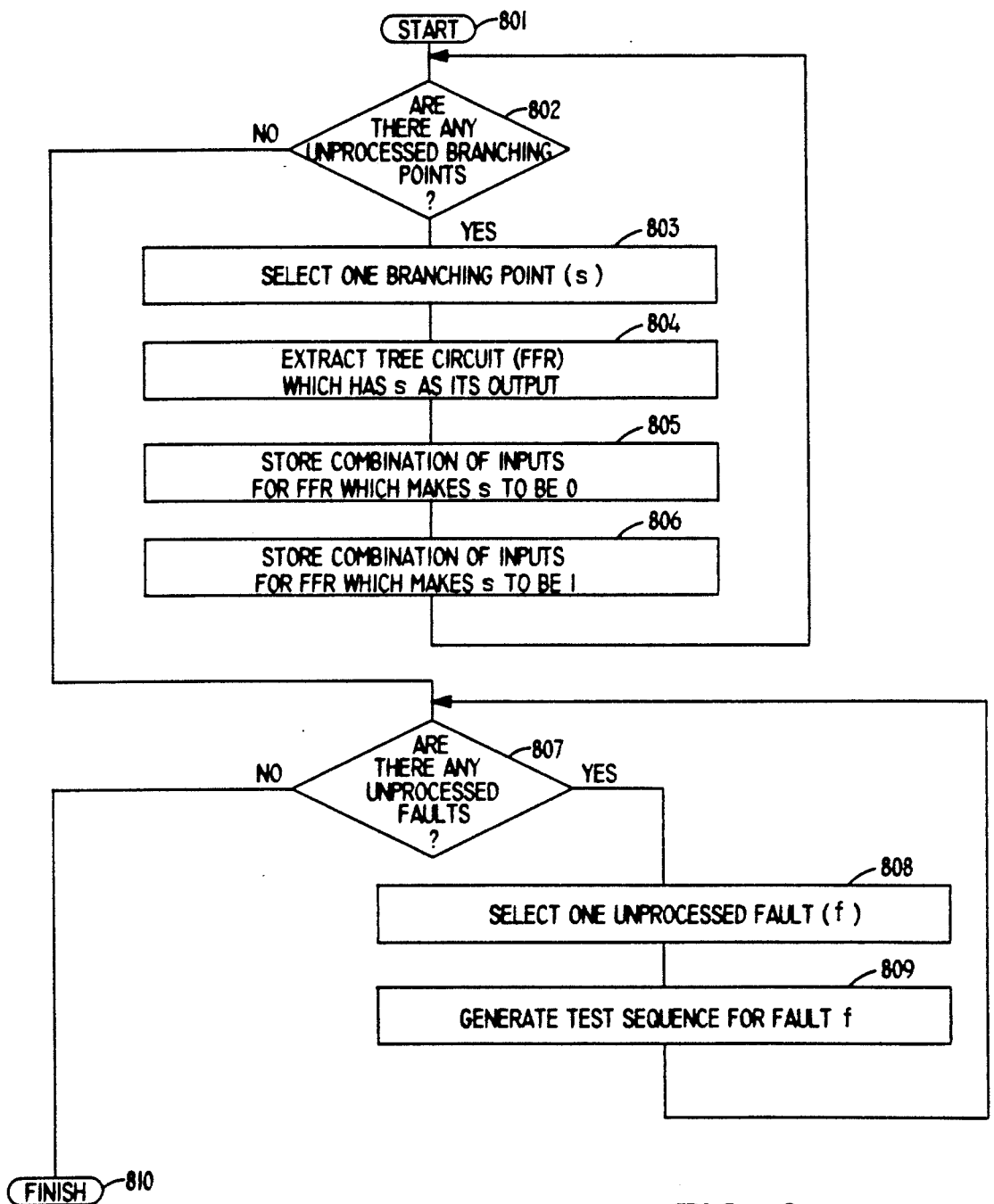

FIGS. 8(a), (b) are flow chart diagrams showing the test sequence generation method of embodiment 8.

Figure 8B:
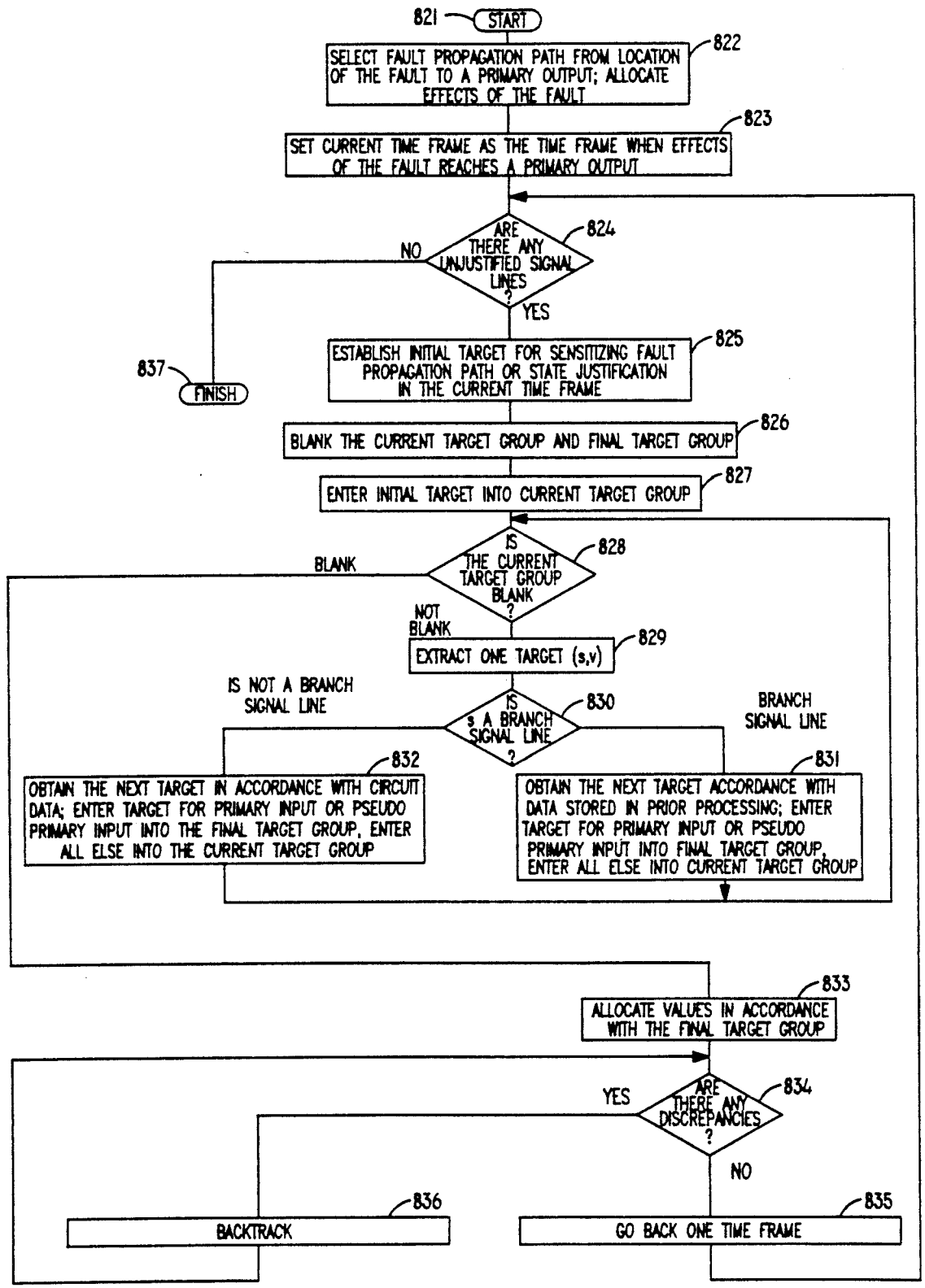
Figure 8C:
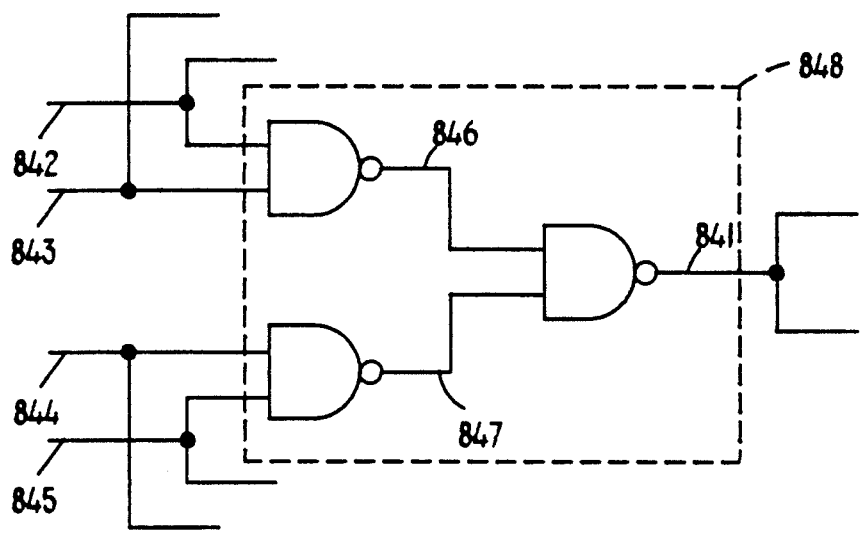

FIG. 8(c) is a circuit diagram used to explain the said method.

Figure 9:
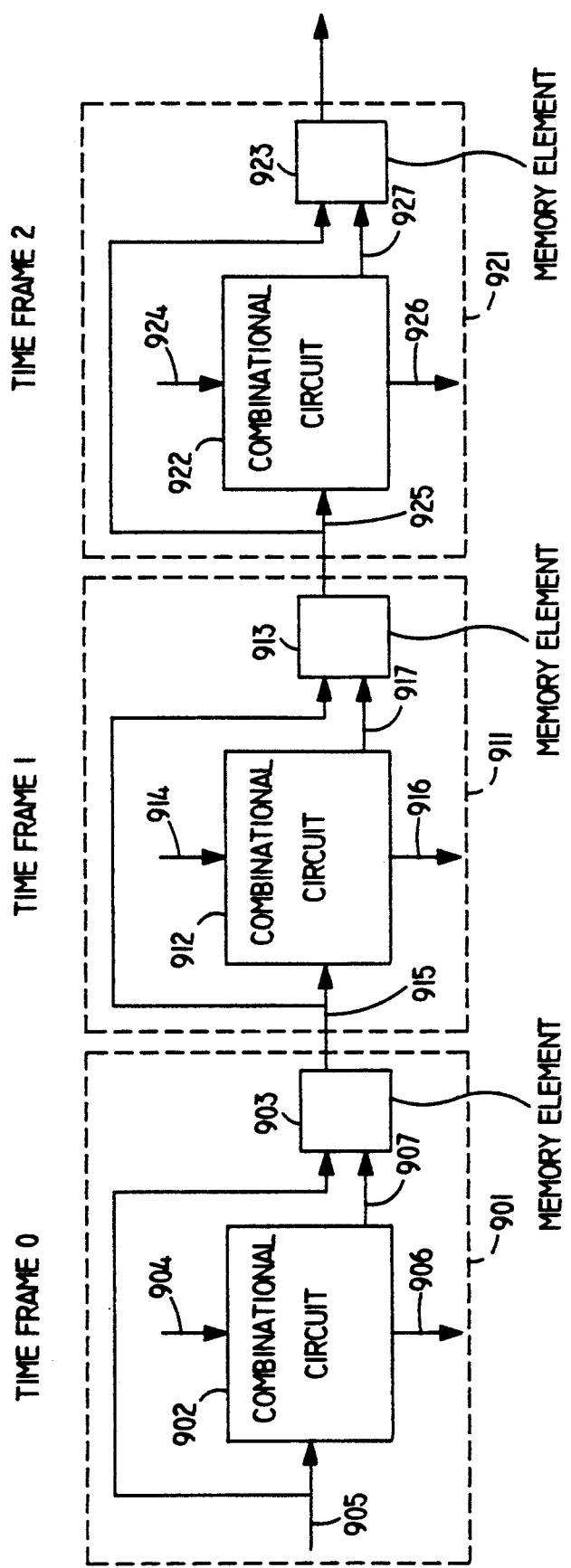

FIG. 9 is a conceptual diagram showing the iterative array method, which is one of the prior art methods for test sequence generation.

Figure 10:
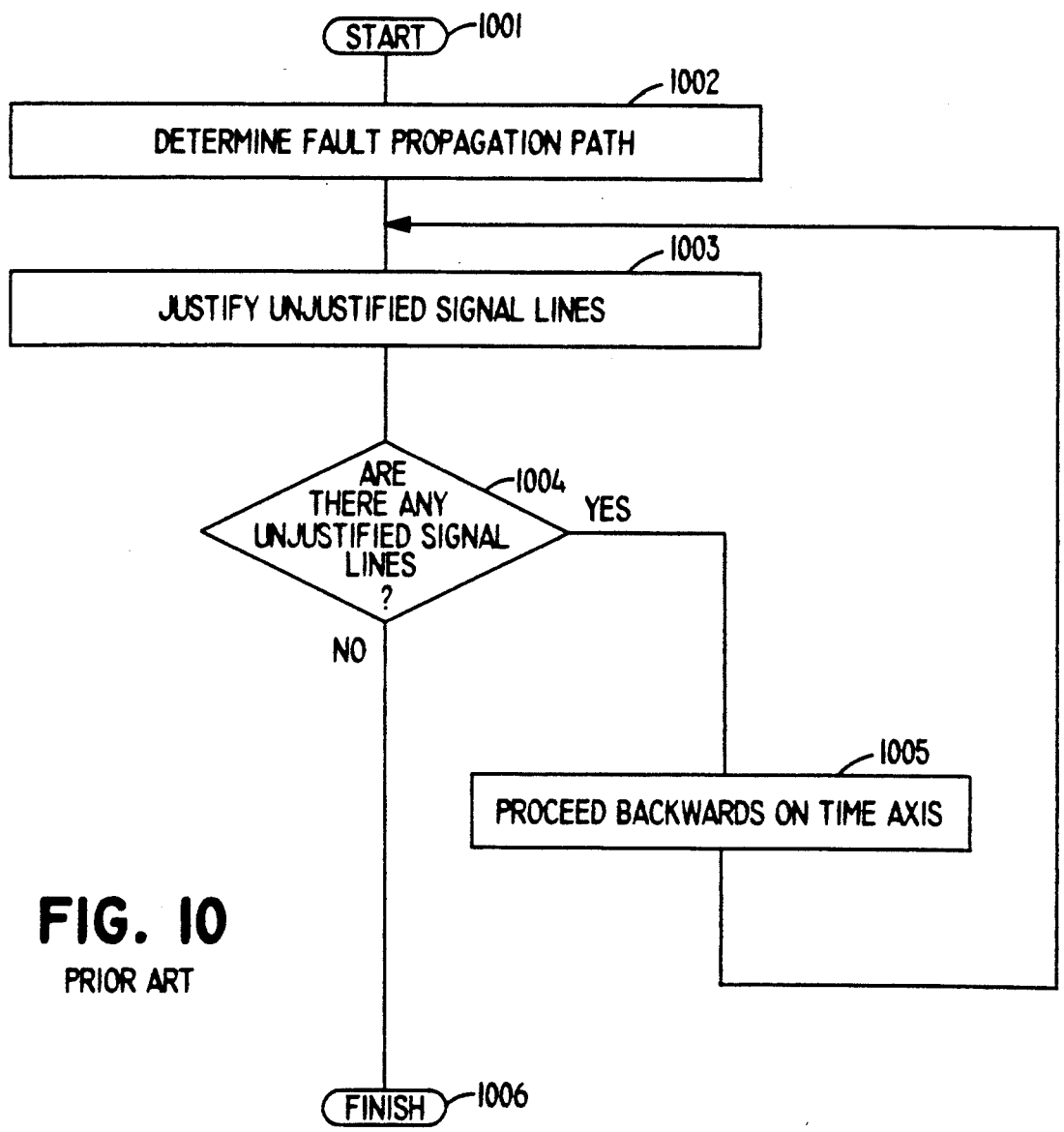

FIG. 10 is a flow chart diagram showing the method of state justification subsequent to determination of a fault propagation path—another prior art method of test sequence generation.

Figure 11:
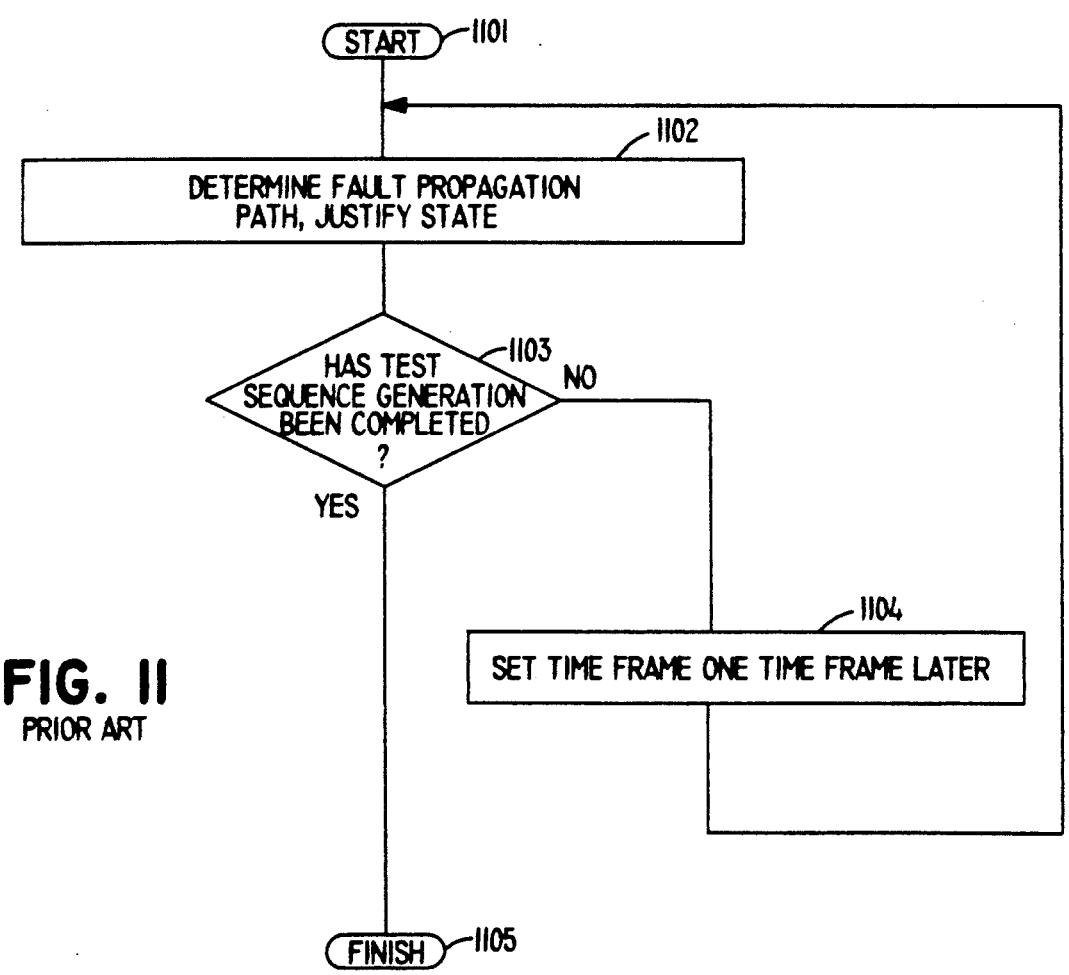

FIG. 11 is a flow chart diagram showing the method of simultaneously determining the fault propagation path and undertaking state justification in reverse direction to the time flow, which is another prior art test sequence generation method.

DETAILED DESCRIPTION OF THE INVENTION

Embodiment 1

The test sequence generation method of embodiment 1 is characterized by: when, as the result of test pattern generation undertaken in the combinational circuit, if the effects of the fault reach at least one of the primary outputs, the values allocated to the pseudo primary inputs are stored; when the effects of the fault reach of at least of the pseudo primary outputs (but not the primary outputs), the values allocated to the pseudo primary inputs and the pseudo primary outputs to which the effects of the fault had reached are stored. In the event that test sequence generation is aborted, these values would be outputted.

FIG. 1(a) is a flow chart diagram of the subject invention's first embodiment. FIG. 1(b) is a circuit diagram of the sequential circuit which is the object of test sequence generation, used to show embodiment 1 of the subject invention.

In FIG. 1(b), 131-133 are primary inputs and 134-136 are primary outputs. 137-139 are pseudo primary inputs and 140-141 are pseudo primary outputs. 143 is a combinational circuit, while 144 is a memory element.

FIG. 1(c) is a conceptual diagram for convenience of explanation, showing the sequential circuit in FIG. 1(b) as an iterative array. In FIG. 1(c), 151-159 are primary inputs; 160-168 are primary outputs; 169-177 are pseudo primary inputs and 178-186 are pseudo primary outputs. In addition, 187-189 are combinational circuits and 190-191 are memory elements.

FIG. 1(d) and FIG. 1(e) are circuit diagrams used to show the test sequence generation method of the subject invention. In FIG. 1(d) and in FIG. 1(e), the same elements, as in FIG. 1(b), are given the same numbers. However, their explanations are omitted. 193-197 are the locations of faults which are the objects of test sequence generation. 194 and 198 represent the primary input and the pseudo primary input with allocated values other than "don't care," at the time when the test input was generated for the combinational circuit 143. 195 represents the primary output to which the effect of the fault had reached at the time the test input was generated for the combinational circuit 143. Also, 199 represents the pseudo primary output to which the effect of the fault had reached at the time the test input was generated for combinational circuit 143.

We shall now explain an embodiment of the test sequence generation method claimed in claim 1, when a single fault occurred, using the flow chart diagram in FIG. 1(a) and the circuit diagrams in FIG. 1(d) and FIG. 1(e).

Processing starts at step 101. The processing at step 102, in the example of FIG. 1(d), has fault 193 as the object of test sequence generation. In the example of FIG. 1(e), fault 197 is the object of test sequence generation. It is noted that pseudo primary inputs 137-139 are considered primary inputs, and pseudo primary outputs 140-142 are considered primary outputs. Relating to combinational circuit 143, the test pattern is generated to detect the fault which is the object of test sequence generation.

Next, in the processing at step 103, it is determined whether or not the effects of the fault reach any of the primary outputs 134-136. In the example of FIG. 1(d), as the effects of the fault reach primary output 134, processing proceeds to step 107 and pseudo primary inputs to which values other than "don't care" are allocated, are stored. It is immaterial where this value is stored, so long as it is located where the value can be retrieved later in the processing at step 111. This location may include, for example, the computer's main memory.

While the effects of the fault also reach pseudo primary output 140, in this case it is not necessary to store the pseudo primary output which is reached by the effects of the fault. This is because, in case test sequence generation was finally aborted, the pseudo primary output which is reached by the effects of the fault is stored for the purpose of outputting data. This is done to show how the effects of the fault could be observed if the memory element was replaced by one having a scan structure. In the case where the effects of the fault had reached the primary output, this fact can be observed at the primary output, even without replacing the memory element by one having a scan structure (for the purpose of observation).

Also in FIG. 1(d), even when the effects of the fault had reached the primary output, it is necessary to store the pseudo primary input to which a value had been allocated. Values are allocated to which the pseudo primary inputs are stored for the purpose of outputting data, in case test sequence generation was finally aborted, showing how, if each of the flip-flops was replaced by one with a scan structure, the effect of the fault could be generated and the said effect propagated to a primary output or to a pseudo primary output.

Once processing at step 107 is completed, processing proceeds to step 109.

As in the example of FIG. 1(e), if it was determined in the processing at step 103 that the effects of the fault had not reached a primary output, processing branches to step 104 to determine whether or not the effects of the fault had reached a pseudo primary output.

The processing at step 104 takes place only when the effects of the fault had not reached a primary output. In the processing at step 104, if the effects of the fault had not reached a pseudo primary output, it would mean that the effects of the fault had reached neither a primary output nor a pseudo primary output. Thus, the test pattern generation for the combinational circuit will fail. In such an event, a shift is made to step 112, without storing the pseudo primary input or the pseudo primary output, and the test sequence generation is immediately terminated.

If in the processing at step 104, as in the example in FIG. 1(e), the effects of the fault had reached the pseudo primary output 141, processing proceeds to step 105. At this step, the pseudo primary output 141 (to which the effect of the fault had reached) and the pseudo primary inputs 137 and 139 (which have been allocated values other than "don't care") are stored.

Next, in the processing at step 106, the fault propagation path from the fault site to a primary output is sensitized, with the object of propagating the effects of the fault to a primary output. While the sensitization of the fault propagation path is a fundamental function of the sequential circuit, in general, there are times when vast amounts of time are required depending on the circuitry so that a time limit is placed on the processing at 106 and a fault propagation path is sensitized.

Processing at step 108 examines whether an abort took place due to a time out during the fault propagation path sensitization in step 106. If an abort did not occur in the processing at step 108, a branch is made to step 109 and test sequence generation takes place for the purpose of state initialization in order to return the circuit to the initial state. Although state initialization is also a fundamental function for a sequential circuit's test sequence generation, in general, there are times when a vast amount of time is required depending on the circuitry. This is so, in the processing at step 109, a time limit is placed on computing time to conduct state initialization.

Processing at step 110 checks whether an abort occurred in the processing at step 109. If no abort occurred, it means that the test sequence generation was successful. Processing then branches to step 112 and the test sequence generation is completed. The test sequence, when the test sequence was normally generated, is the output at step 112.

In the processing at step 108 or step 110, where examination takes place as to whether an abort occurred or not, if it was determined that an abort occurred, the processing moves to step 111 and either the pseudo primary inputs stored from the processing at 107, or, the pseudo primary outputs and the pseudo primary inputs stored from the processing at 105 are outputted. After completing the processing at step 111, a branch is made to step 112 and the test sequence generation is completed.

In accordance with this method, even when the processing is aborted before the completion of test sequence generation, the memory elements should be scanned on the basis of the test pattern generation for the combinational circuit. This is done in order to make the test possible. Therefore, it is possible to utilize the partial scan design with good efficiency.

Embodiment 2

The test sequence generation method of embodiment 2 is characterized by the utilization of the results of test input generation conducted for a fault which is assumed to be a pseudo primary input. In this embodiment, the concept of there being classes of pseudo primary inputs is used. A Class 0 pseudo primary input indicates that it is difficult to propagate the effects of the fault, assumed to be at the said pseudo primary input, to either a primary output or to a pseudo primary output. A Class 1 pseudo primary input indicates that, while it is difficult to directly propagate the effects of the fault, which is assumed to be at the said pseudo primary input to a primary output, it is easy, in the final analysis, to propagate the same to a primary output via the pseudo primary outputs. A Class 2 pseudo primary input signifies that it is easy to directly propagate the effects of the fault assumed to be at the said pseudo primary input to a primary output.

FIGS. 2(a)-(c) are flow chart diagrams showing the test sequence generation method of embodiment 2. FIG. 2(d) is a circuit diagram used to explain the method of classifying the pseudo primary input. 251 is the fault propagation path for the fault assumed to be at pseudo primary input 137, while 252 is the propagation path for the fault assumed to be at pseudo primary input 138.

FIG. 2(e) is a circuit diagram used for the purpose of explaining the test sequence generation method of this embodiment. 261 represents the fault which is the object of the test sequence generation, and 262 represents the path propagating the effects of the fault as the result of test sequence generation performed for the combinational circuit 187. 263 represents the propagation path for the effect of the fault assumed by prior processing to be at the pseudo primary input 172.

First, we shall explain the overall processing in this embodiment, using FIG. 2(a).

Processing starts at step 201. At steps 202-204, each pseudo primary input is classified. At step 202, a check is made to determine whether there are any unprocessed pseudo primary inputs. In the event it was determined that all pseudo primary inputs had been processed, processing branches to step 205. If there are any unprocessed pseudo primary inputs, a branch is made to step 203.

The processing at step 203 selects the pseudo primary input PPIj.

Processing at step 204 classifies the pseudo primary input of the selected pseudo primary input PPIj.

Test sequence generation is undertaken for each given fault in steps 205-207.

At step 205, a check is made whether there are unprocessed faults; if there are none, processing goes to step 208 and all processing is finished. In case there are unprocessed faults, a branch is made to step 206.

The processing at step 206 selects an unprocessed fault f; while the processing at step 207 generates a test sequence for the fault f selected in the processing at step 206.

FIG. 2(b) is a flow chart diagram showing the pseudo primary input classification method in step 204. We shall now explain the pseudo primary input classification method using FIG. 2(b) and FIG. 2(d).

Processing starts at step 211. In the processing at step 212, paying attention to the combinational circuit, the test pattern is generated for the fault assumed to be at pseudo primary input. As the result of processing at step 212 for the pseudo primary input 137 of FIG. 2(d), it is assumed that the effects of the fault had reached primary output 135 via the fault propagation path shown in 251. Also, as the result of generating a test input for the combinational circuit with respect to the pseudo primary input 138, it is assumed that the effects of the fault had reached the pseudo primary outputs 140 and 142 via the fault propagation path of 252.

In the processing at step 213, a check is made to determine whether or not there are effects of the fault at a primary output; a branch is made to step 224 if there are effects of the fault at a primary output, and to 214 if there are no effects of the fault at a primary output. In the example where processing took place for the pseudo primary input 137 of FIG. 2(d), effects of the fault had reached primary input 135 so a branch is made to step 224. When processing takes place for the pseudo primary input 138, a branch is made to step 214 since the effects of the fault had not reached the primary output.

In processing at step 224, the pseudo primary input's class is set as Class 2, the test input obtained in processing at step 212 is stored and classification of pseudo primary input PPIj is finished. In the example of processing for pseudo primary output 137 in FIG. 2(d), the class for pseudo primary input 137 is set as Class 2 and the test input obtained in test input generation at step 212 is stored.

In processing at step 214, a check is made as to whether effects of the fault had reached a pseudo primary output or not. If effects of the fault had reached a pseudo primary output, a branch is made to step 215; if the effects had not reached the same, then a branch is made to step 226. In the processing for the pseudo primary input 138 of FIG. 2(d), effects of the fault had reached pseudo primary outputs 140 and 142 so the branch is made to step 215.

In processing at step 226, the class of the pseudo primary input is set at 0, a branch is made to step 227, and classification is ended.

In processing at step 215, the set of pseudo primary outputs to which effects of the fault had reached is referred to as a SPO. In processing for pseudo primary input 138 of FIG. 2(d), effects of the fault had reached pseudo primary outputs 140 and 142 so that pseudo primary outputs 140 and 142 are placed in the SPO.

In steps 215-218, checks are made for each pseudo primary output to which effects of the fault had reached to determine if there are means to propagate the effects of the fault to a Class 1 or Class 2 pseudo primary input.

In processing at step 216, a check is made to determine if there are key elements in the SPO of pseudo primary outputs to which the effects of the fault had reached; moving to step 217 if so, and to step 226 if not so. In the case of processing for pseudo primary input 138 of FIG. 2(d), since there are key elements, a branch takes place to step 217.

In processing at step 217, pseudo primary output PPOk is selected from the set SPO of the pseudo primary outputs reached by the effects of the fault and this is removed from the SPO. In the example of processing pseudo primary output 138 in FIG. 2(d), 140 would be removed.

Processing at step 218 examines what type of value should be allocated to the input and output of the memory element in order to propagate the effects of the fault, at pseudo primary output PPOk, to the pseudo primary input PPIm located on the output side. If it is not possible to propagate to the pseudo primary input, a branch is made to step 216; if propagation is possible, a branch is made to step 219. In the example of processing pseudo primary input 138 in FIG. 2(d), effects of the fault at pseudo primary output 140 can be propagated to the pseudo primary input 137.

Processing at step 219 examines whether the pseudo primary input PPIm, which is located on the output side of the pseudo primary output PPOk to which the effects of the fault had reached, had been classified. If not classified, a branch is made to step 220, while a branch is made to step 221 if classified. In the example of processing pseudo primary input 138 of FIG. 2(d), a branch is made to step 221 since the pseudo primary input 138 has been classified.

In the processing at step 220, in accordance with processing shown in FIG. 2(b), the classification of the pseudo primary input is conducted reflexively for the pseudo primary input PPIm.

In step 221, the classification of the pseudo primary input PPIm is examined. A branch is made to step 216 if the pseudo primary input PPIm's classification was Class 0. A branch is made to step 222 if the pseudo primary input PPIm was classified Class 1 or Class 2. For processing the pseudo primary input 138 of FIG. 2(d), the classification of the pseudo primary input 137 is Class 2, so the branch is made to step 222.

At step 222, the pseudo primary input PPIj is set to Class 1. In addition, the test input (obtained in processing at step 212) and the value for propagating the effects of fault at pseudo primary output PPOk to the pseudo primary input PPIm (obtained in step 218) are stored with pseudo primary input PPIm. When processed for FIG. 2(d)'s pseudo primary input 138, the pseudo primary input is set to Class 1. In addition, the test input (obtained at step 212) and the value for propagating the effects of the fault at pseudo primary output 140 to pseudo primary input 137 (obtained at step 218) are stored with the pseudo primary input 137.

At step 223, the process of classifying the pseudo primary input PPIj is finished.

FIG. 2(c) is a flow chart diagram used to explain test sequence generation 207 which utilizes the data of the classified pseudo primary input. Using FIG. 2(c) and FIG. 2(e), the test sequence generation method will be explained.

Processing commences at step 231. At step 232, paying attention to the combinational circuit, a test pattern is generated for the given fault. In FIG. 2(e), a test sequence is generated for fault 261.

Processing at step 233 examines whether the effects of the fault had reached the primary outputs or not. If the effects of the fault had reached the primary outputs a branch is made to step 244. A branch is made to step 234 if the effects of the fault had not reached the primary outputs. In FIG. 2(e), since the effects of the fault had not reached the primary outputs, a branch is made to step 234.

At step 234, a check is made as to whether or not the effects of the fault had reached the pseudo primary outputs. A branch is made to step 235 if the effects of the fault had reached the pseudo primary outputs. A branch is made to step 246 if the effects of the fault had not reached the pseudo primary outputs, and the test sequence is terminated. In the case of FIG. 2(e), the effects of the fault had reached the pseudo primary outputs 178 and 180, so the branch is made to step 235.

In the processing at step 235, the set of pseudo primary outputs, to which the effects of the fault had reached, is referred to as a SPO. In FIG. 2(e), the key elements of the SPO would be 178 and 180.

Processing at step 236 examines whether or not there are key elements in the SPO of the pseudo primary output. If there are key elements in the set, processing goes to step 237; if there are no key elements in the set, a branch is made to step 243. In FIG. 2(e), a branch is made to step 237 since there are key elements in the SPO.

In the processing at step 237, a pseudo primary output PPOk is selected from the SPO, of the pseudo primary outputs to which the effects of the fault had reached, and removed from the SPO. In the case of FIG. 2(e), 178 would be selected.

In processing at step 238, value allocation is undertaken for the purpose of propagating the effects of the fault, which had reached pseudo primary output PPOk, to the pseudo primary input PPIm which is located on the output side. If it is possible to propagate the effects of the fault to the pseudo primary input PPIm, a branch is made to step 239; if it is not possible, the branch is made to step 236. In the case of FIG. 2(e), it is deemed possible to propagate the effects of the fault at pseudo primary output 178 to the pseudo primary input 172 on the output side, and processing moves to step 239.

In processing at step 239, the class of pseudo primary input PPIm is examined. If the class of pseudo primary input PPIm is Class 2, the branch is made to step 240, while the branch is to step 236 if its class is Class 0 or Class 1. In FIG. 2(e), a branch is made to step 240 since the pseudo primary input 172 is Class 2.

Processing at step 240 compares the test input for pseudo primary input PPIm obtained in prior processing at step 224 with the test input obtained at step 232, and, the value allocation made for propagating the effects of the fault at pseudo primary output PPOk, obtained in processing at step 238, to the pseudo primary input PPIm.

Processing at step 241 looks for inconsistencies generated by the processing at step 240. If there are inconsistencies, a branch is made to step 236; while the branch is to step 242 if there are none.

In step 242, the test pattern of the pseudo primary input PPIm, obtained in prior processing, and the values obtained in processing at step 238 are allocated; any allocations to lines other than primary outputs are regarded as being unjustified signal lines. In FIG. 2(e), the test pattern obtained for the pseudo primary input 172, obtained in prior processing, and values obtained in processing at step 238 are allocated. Any lines to which values are allocated, other than primary outputs, are considered to be unjustified signal lines.

The processing at step 243 generates test sequences for the purpose of sensitizing the fault propagation path. This processing is to propagate the effects of the fault from the location of the fault to a primary output, by justifying the unjustified signal lines.

Processing at step 244 generates test sequences for the purpose of state initialization. This process enables the circuit to transform from the initial state to the state capable of generating the effects of the fault.

Processing is finished at step 245.

In accordance with this method, in the process of generating test sequences for each fault, the results of prior processing can be used as they are for the segment of fault propagation path sensitization; greatly simplifying same and making possible efficient test sequence generation.

Embodiment 3

The method of test sequence generation in embodiment 3 is a method characterized by utilizing the results of generating a test sequence for a fault assumed to be at a pseudo primary input.

FIG. 3(a) is a flow chart diagram of the test sequence generation method of embodiment 3. FIG. 3(b) is a circuit diagram used to explain the method of test sequence generation of embodiment 3. In FIG. 3(a), the processing in steps 239-242 of FIG. 2(c) has been replaced by steps 301-310; and, explanations for identical processing as in FIG. 2(c) are omitted.

In the processing at step 301, the object is to find a pseudo primary output to which the effects of the fault had reached and which is capable of propagating the effects of the fault to a pseudo primary input on the output side and where the said pseudo primary input is either Class 1 or Class 2. In the event that the pseudo primary input is Class 0, the branch is made to step 236, while the branch is to step 302 in case of Class 1 or Class 2. FIG. 3(b) shows a case where the pseudo primary output 180, to which the effects of the fault at step 331 had reached, is capable of propagating the effects of the fault to the output side's pseudo primary input 174, and 174 is Class 1. Accordingly, the branch here is to step 302.

In processing at step 302, a comparison is made between the test input for pseudo primary input PPIm obtained in prior processing, and, the test input obtained in step 232 and the value allocated to propagate the effects of the fault at the pseudo primary output PPOk to the pseudo primary input PPIm obtained in the processing at step 238. In FIG. 3(b), the test pattern for pseudo primary input 174 obtained in prior processing is compared with the test pattern obtained in processing at step 232, and, the value allocated for propagating the effects of the fault at pseudo primary output 180 to the pseudo primary input 174, as obtained in processing at step 238.

At step 303, a check is made to determine if inconsistencies occurred in the processing at 302. A branch is made to step 236 if there were inconsistencies, and to step 304 if there were no inconsistencies. In FIG. 3(a), assuming no discrepancies, the branch is made to step 304.

In the processing at step 304, the SPT, where the test sequence will be temporarily stored, is blanked.

In processing at step 305, the test input obtained in FIG. 2(b)'s steps 224 or 222, classifying the pseudo primary inputs, and the value allocation obtained in 238 are added to the SPT. In FIG. 3(b), the test sequence obtained in prior processing for fault assumed to be at 174, and, the value obtained in step 238 for propagating the effects of the fault at pseudo primary output 180 to pseudo primary input 174, are stored in the SPT.

Then, in the processing at steps 306-309, the output side is examined reflexively, and, until a Class 2 pseudo primary input is encountered, the test inputs obtained in prior processing for classifying the pseudo primary inputs and the value allocations for propagating to the output side's pseudo primary input are sequentially added to the SPT.

In processing at step 306, the classification for pseudo primary input PPIm is examined, branching to step 307 if Class 1 and to step 310 if Class 2. In FIG. 3(b), the branch is to step 307 since the classification of pseudo primary input 174 is Class 1.

In processing at step 307, the target pseudo primary input for propagating the fault at pseudo primary input PPIm, obtained in prior processing, is made PPIn. In FIG. 3(b), the pseudo primary input 334 is made PPIn.

The processing at step 308 adds to the SPT the test input for pseudo primary input PPIn, obtained previously, and the value to propagate the effects of the fault at PPIm to PPIn. In FIG. 3(b), the test sequence for pseudo primary input 334, obtained in prior processing, and the value for propagating the effects of the fault at 174 to pseudo primary input 334 are added to the SPT.

The processing at step 309 sets PPIn as the next PPIm, and branches to step 306. For FIG. 3(b), pseudo primary input 334 is set as the next PPIm and the branch is to step 306. The processing at steps 306 through 309 are repeated until, finally, it is determined at 306 that a Class 2 pseudo primary input 176 had become PPIm. At this point a branch is made to step 310.

The processing at step 310 allocates the sequence stored in the SPT; any allocations to other than primary inputs are made unjustified signal lines.

In accordance with this method, in the same manner as in the second embodiment, the processing to generate test sequences for sensitizing fault propagation paths, among the test sequences for each fault, can be greatly reduced since the results of prior processing can be used as they are. Also, in comparison to the second embodiment, this has an advantage in that the scope for utilizing the results of prior processing is greater.

Embodiment 4

The method of test sequence generation in embodiment 4 is characterized by the utilization of the P controllability cost and N controllability cost which represent the difficulty of generating rise and fall signals.

FIG. 4(a) is a flow chart diagram showing the method of test sequence generation of embodiment 4. FIGS. 4(b)–(e) are figures to explain the processing at step 402 to obtain the P controllability cost and the N controllability cost. FIG. 4(f) is a circuit diagram to explain the test sequence generation at step 403 utilizing the P controllability cost and the N controllability cost. FIG. 4(g) is a table for the 0 controllability cost, 1 controllability cost, P controllability cost and the N controllability cost for each signal line of the circuit in FIG. 4(f).

The method of test sequence generation of the subject embodiment will be explained below, using FIGS. 4(a)–(g).

Processing commences at step 401. At step 402, a pre-processing for test sequence generation at step 403, in addition to the usually utilized 0 controllability cost and 1 controllability cost, the P controllability cost and N controllability cost are computed. The method for this will be explained later in detail using FIGS. 4(b)–(e). At 403, as will be explained in FIG. 4(b), the 0 controllability cost, 1 controllability cost, P controllability cost and N controllability cost will be used to generate the test sequence.

A number of computing methods are known for the 0 controllability cost and the 1 controllability cost. We shall expand on one of these presented by M. Abramovici et al.; in "SMART and FAST": "Test Generation for VLSI Scan-Design Circuits", IEEE Design and Test of Computers, August 1986, pp. 43–45, which presents a method to obtain the 0 controllability cost and the 1 controllability cost with the combinational circuit as the object, and explain the new method of adding the P controllability cost and the N controllability cost.

In addition to the above, the subject invention is suitable for use with, among others, the method disclosed by L. Goldstein in "Controllability/Observability Analysis of Digital Circuits", IEEE Transaction on Circuit and Systems, September 1979, pp. 685–693.

In FIGS. 4(b)–(e), 0 controllability cost, 1 controllability cost, P controllability cost and N controllability cost for signal line 1 are represented respectively by $C0(1)$, $C1(1)$, $CP(1)$ and $CN(1)$. The term controllability cost represents the difficulty of controlling the state of a given signal line to a determined value; the higher the value, the greater the difficulty and the lower the value the greater the ease of control. Since primary inputs can be controlled externally, if signal line 1 is a primary input then $C0(1)=C1(1)=CP(1)=CN(1)=0$.

Figure 4B:
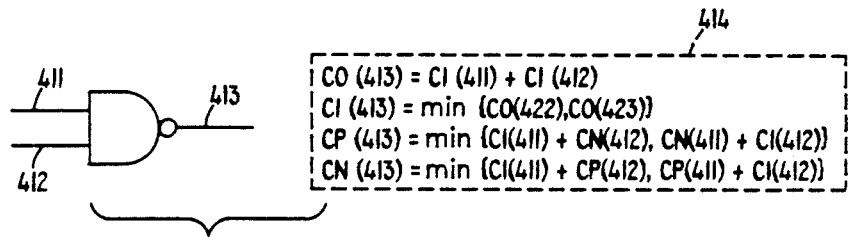

FIG. 4(b) shows the method of obtaining the 0 controllability cost, 1 controllability cost, P controllability cost, and N controllability cost for the output of a logic gate. 411 and 412 are the input signal lines for the NAND gate and 413 is the NAND gate's output signal line. 414 is the formula used to calculate NAND gate output side's 0 controllability cost, 1 controllability cost, P controllability cost and N controllability cost.

In order to control the NAND gate's output signal line 413 to 0, it is necessary to control both of NAND gate's input signal lines, 411 and 412, to 1. Thus the 0 controllability cost C0(413) for the NAND gate's output signal line 413 is the sum of NAND gate's input signal line 411's 1 controllability cost C1(411), and the NAND gate's input signal line 412's 1 controllability cost C1(412). In the same manner, to control the NAND gate's output signal line to 1, it is necessary to control either of the NAND gate's input signal lines, 411 or 412, to 0. Thus the 1 controllability cost C1(413) for the NAND gate's output signal line 413 will be the lesser of the 0 controllability costs, C1(411) or C1(412), for NAND gate's input signal lines 411 and 412.

In order to generate a rising or falling edge signal at NAND gate's output signal line 413, a fall signal can be applied to either of the NAND gate's input signal lines 411 or 412 and control the other to 1, or, applying fall signals to both the NAND gate's input signal lines 411 and 412.

Here the probability of applying a plurality of rising or falling edge signals to one gate is deemed low. The P controllability cost CP(413) for the NAND gate's input signal line 413 is equal to the lesser of the sum of the NAND gate's input signal line 411's 1 controllability cost C1(411) and the NAND gate's input signal line 412's N controllability cost CN(412), or the sum of the NAND gate's input signal line 411's N controllability cost CN(411) and the NAND gate's input signal line 412's 1 controllability cost C1(412).

With regard to the NAND gate's output signal line 413's N controllability cost CN(413), this also can be obtained in the same manner as that for the P controllability cost, as shown by the formula for 414.

Figure 4C:
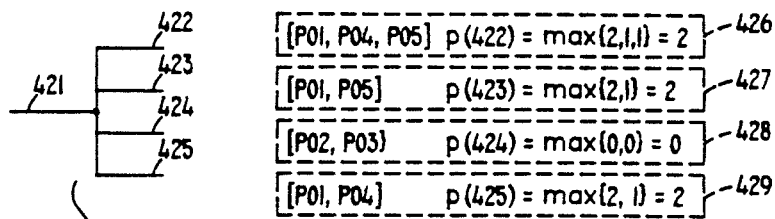
Figure 4C:
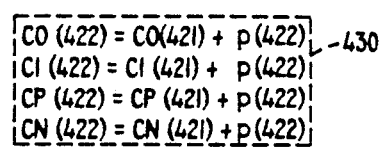

FIG. 4(c) is a figure showing the method for calculating the 0 controllability cost, 1 controllability cost, P controllability cost and N controllability cost at the branching point. 421 is the branching signal line, 422-416 are the branch signal lines, while 426-429 are used when calculating the branch signal lines' 0 controllability cost, 1 controllability cost, P controllability cost and N controllability cost to explain the reconvergence penalty. 430 is the formula used to calculate branch signal line 422's 0 controllability cost, 1 controllability cost, P controllability cost and N controllability cost.

In general, it is known that the main cause of difficulty in generating a test sequence is reconvergent branching. That is, when allocating values to different reconvergent paths, inconsistencies are created between the value allocations to the point of reconvergence and to the reconvergence branch point making it difficult to generate the test sequence.

In order to reflect this, the concept of reconvergence penalty is introduced and the branch signal lines are allocated higher controllability cost than the branching signal lines. The primary outputs which can be reached from branch signal line 422 are shown within the left bracket in the formula of 426. In this example, there are three primary outputs which can be reached from the branch signal line 422: PO1, PO4 and PO5. In case different branch signal lines which are branched from the same branching signal line can reach the same primary output, reconvergence takes place. It is considered that the greater the number of reconvergent paths, the greater the difficulties in generating the test sequence. So, of the primary outputs reachable from branch signal lines, the primary output with the greatest number of branch signal lines which can reach it receives a penalty of the branch signal line's controllability cost for the number of other branch signal lines. In the example of FIG. 4(c) of the primary outputs PO1, PO4 and PO5 which can be reached from branch signal line 422, there are two branch signal lines 423 and 425 which can also reach PO1, one branch signal line 425 can reach PO4 and one branch signal line 423 can reach PO5. Accordingly, the reconvergence penalty p(422) for branch signal line 422 would be 2. The reconvergence penalties for the outer branch signal lines 423, 424 and 425 can be calculated in the same manner; respectively, p(423)=2, p(424)=0 and p(425)=2.

As shown in the formula in 430, the branch signal line 422's 0 controllability cost C0(422) is the sum of branching signal line 421's 0 controllability cost C0(421) and the reconvergence penalty p(422). In regard to branch signal line 422's 1 controllability cost C1(422), P controllability cost CP(422) and N controllability cost CN(422), they can be calculated in the same manner as for the 0 controllability cost using the formula 430.

Figure 4D:
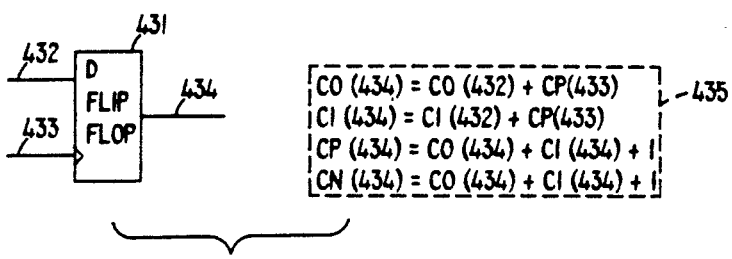

FIG. 4(d) is a figure showing the method to obtain the 0 controllability cost, 1 controllability cost, P controllability cost and N controllability cost for the memory element's output signal line. 431 is a D flip-flop, 432 is the data input signal line for D flip-flop 431, 433 is the D flip-flop 431's control input signal line, and, 434 is the output signal line for the D flip-flop 431. 435 is the calculation formula for the D flip-flop's 0 controllability cost, 1 controllability cost, P controllability cost and N controllability cost.

To control the output of the D flip-flop 431's output signal line to 0, 0 must be set at the input signal line 431 of the D flip-flop 431, and generate a rise signal at the control input signal line 433 of the D flip-flop 431. Accordingly, the 0 controllability cost C0(434) for the D flip-flop 431's output signal line 434 is the 0 controllability cost C0(432) of the D flip-flop 431's input signal line 432 to which is added the P controllability cost CP(433) of the D flip-flop 431's control input signal line 433.

Likewise, the 1 controllability cost C1(434) for the D flip-flop 431's output signal line 434 is the sum of 1 controllability cost C1(432) of D flip-flop 431's data input signal line 432, and, P controllability cost CP(433) of D flip-flop 431's control input signal line 433.

In setting rise or fall signals for the output side of the memory element, 0 and 1 cannot just be established independently. Their sequence must also be controlled. So, for the P controllability cost and N controllability cost, a memory element penalty is added to the sum of the 0 controllability cost and the 1 controllability cost. Specially determined values can be assigned as the memory element penalty, but 1 will be used here.

FIG. 4(e) is a circuit diagram explaining how 1 is being added as the memory element penalty. FIG. 4(e) represents a RS latch, 441 and 442 are inputs and 445 is the output. The circuit contains branch signal lines 444 and 445, branched from branching signal line 443. When generating 0 and 1 at 445 to form rise or fall signals, since at the time when the second signal appears at the branch signal line 445, the first signal effects the branch signal line 445, it can be considered that 445 is located on the reconvergence path. Accordingly, 1 is added as the memory element penalty only when the memory element output's P controllability cost and N controllability cost are being obtained.

FIG. 4(f) is a circuit diagram used to explain test sequence generation 403 utilizing P controllability cost and N controllability cost. 451 is a D flip-flop and 452 through 460 are signal lines. FIG. 4(g) is a table showing the 0 controllability cost (C0), 1 controllability cost (C1), P controllability cost (CP) and N controllability cost (CN) for each signal line of the circuit in FIG. 4(f). As can be seen from the table, at 457, P controllability cost and N controllability cost are greater than the sum of 0 controllability cost and 1 controllability cost. This indicates that there is a memory element on the input side of 457 and that it is difficult to generate rise and fall signals.

It will be shown below that in the prior art a rise signal would be allocated to 457 where in truth it is difficult to generate rise and fall signals, while in the method of the subject embodiment this sort of allocation would not take place.

Consider the case where by generating a rise signal on signal line 460, the effect of a fault on signal line 452 is propagated to signal line 453. To generate a rise signal on signal line 460, signal line 458 can be controlled to a fall signal and signal line 459 to 1; or, signal line 458 can be controlled to 1 and signal line to a fall signal. In the former, the cost is CN(458)+C1(459)=28, while in the latter C1(458)+CN(459)=27 so the latter would be selected. Then, in order to make the signal line 458 be 1, the signal line with lower 0 controllability cost between 454 and 455 will be selected. Since in this case they are both 5, and either one will be suitable, signal line 454 will be controlled to 0. In order to generate a fall signal on signal line 459, CP(456)+C1(457) and C1(456)+CP(457) are compared. As the former is lower in cost, 456 will be controlled to rise signal and signal line 457 to 1.

On the other hand, in the prior art method of utilizing only the 0 controllability cost and 1 controllability cost, in order to maintain the signal line 460 to 0, signal lines 454 and 457 are controlled to 0 and to control the signal line 460 to 1, signal lines 456 and 457 are controlled to 1. Therefore, unlike the subject invention's case, attempt is made to control 457, with a high P controllability cost, to a rise signal. As noted above, in accordance with the subject invention, a testability measure with much greater accuracy is being used so that efficient test sequence generation can be undertaken.

Embodiment 5

The method of test sequence generation of embodiment 5 is characterized by utilizing the P controllability cost and the N controllability cost, which represent the difficult of generating the rise and fall signals, to calculate the observability cost.

FIG. 5(a) is a flow chart diagram showing the method of test sequence generation of embodiment 5. FIG. 5(b) is a figure explaining the processing at step 503 to obtain the observability cost utilizing the P controllability cost and the N controllability cost. FIG. 5(c) is a circuit diagram explaining the test sequence generation at step 504, utilizing the observability cost calculated by using the P controllability cost and the N controllability cost. FIG. 5(d) is a table showing the 0 controllability cost, 1 controllability cost, P controllability cost, and N controllability cost for each signal line in FIG. 5(c).

FIGS. 5(a)–(d) will be used to explain the test sequence generation method of the subject embodiment. Processing commences at step 501, and 0 controllability cost, 1 controllability cost, P controllability cost, and N controllability cost are obtained in processing at step 502. Their contents are identical with those in step 402 of embodiment 4. In processing at step 503, the observability cost is obtained by using 0 controllability cost, 1 controllability cost, P controllability cost, and N controllability cost. In the processing at step 504, test sequence generation is undertaken using 0 controllability cost, 1 controllability cost, P controllability, and N controllability cost.

In FIG. 5(b), 511 represents a D flip-flop, while 512 represents the data input signal line of D flip-flop 511; 513 represents the control input signal line of D flip-flop 511; and, 514 represents the output signal line of D flip-flop 511. 515 is the calculation formula for obtaining the observability cost for D flip-flop's input signal line. The cost of observing the effects of fault in data input signal line 412 is represented by the sum of the cost of propagating the effects of data input signal line 512's fault to the output signal line 514, and, the cost of observing the effects of the fault at the output signal line 514. Accordingly, as shown in 515, this can be obtained as the sum of costs for controlling the control input signal line 513 to a rise signal, necessary for propagating the effects of the fault at data input signal line 512 to the output signal line 514, that is to say, control input signal line 513's P controllability cost CP(513), and the cost of observing the fault at output signal line 514, that is to say, the observability cost OB(514) for output signal line 514.

The cost of observing the effects of the fault at control input signal line 513 of the D flip-flop would be the sum of the cost of propagating the effects of the fault at the control input signal line 513 to the D flip-flop's output signal line 514, and the cost of observing the effects of the fault at the output signal line 514. In order to propagate the effects of the fault at the control input signal line 513 to the output signal line 514, it is sufficient to establish different values for the data input signal line 512 and the output signal line 514. Since the cost of setting 0 to 512 and 1 to 514, and, the cost of setting 1 to 512 and 0 to 514 are both expressed as C0(512)+C1(512)+CP(513), OB(513) can be obtained from the second formula of 515.

In FIG. 5(c), 521 and 522 are D flip-flops and 523–529 are signal lines. FIG. 5(d) is a table showing the controllability cost and observability cost for each signal line of FIG. 5(c). In this case, propagation is undertaken using 525, which has the lower observability cost of 524 and 525.

In accordance with the subject invention, by utilizing the observability cost with higher accuracy, the efficiency of fault propagation is improved.

Embodiment 6

The method of test sequence generation in embodiment 6 is characterized by representing the effects of the fault by the presence or lack of presence of rise or fall signals, when propagating the effects of the fault to the memory element's control input.

FIG. 6(a) and FIG. 6(b) are flow chart diagrams showing a method of test sequence generation of embodiment 6. 641 and 642 are D flip-flops, 642–649 are primary inputs, 650 through 654 are signal lines, and 655 is a primary output.

The subject embodiment's method of test sequence generation will be explained using FIGS. 6(a)-(c)

Processing commences at step 601. Processing at steps 602-607 is for the purpose of identifying signal lines where the effects of the fault can reach only the control signal line of the memory element. Through this processing, signal lines which can reach only the control signal line of the memory element are classified as control signal lines; all other signal lines are classified as data signal lines.

Processing at step 602 examines whether there are any unjustified signal lines. Processing shifts to step 603 if there are any unjustified signal lines, and to step 608 if there are none.

Processing at step 603 selects a signal line s.

At step 604, the combinational circuit is examined as to whether there is a path from the signal line s to the input of the memory element or to a primary output.

Processing at step 605, as the result of step 604, depends on whether there is a path from the signal line s to the memory element's input or to a primary output. A branch is made to step 706 if there is a path, or to step 606 if there is no path.

Processing at step 606 sets the signal line s as a control input signal line.

Processing at step 607 sets the signal line s as a data input signal line.

In the circuit of FIG. 6(c), from processing at steps 602 through 607, signal lines 647, 648, 650, 653 and 655 become data signal lines, while signal lines 645, 646, 649, 651, 652 and 654 become control signal lines.

In the processing at steps 608 through 611, test sequence generation takes place for each fault. Processing at step 608 examines whether there are any unprocessed faults. A branch is made to step 609 if there are unprocessed faults; if there are none, a branch is made to step 612 and all processing is completed.

Processing at step 609 selects an unprocessed fault f.

Processing at step 610 generates a test sequence for sensitizing the fault propagation path.

Processing at step 611 generates a test sequence for state initialization.

FIG. 6(b) is a flow chart diagram explaining test sequence generation 610 for sensitizing the fault propagation path.

Processing commences at step 621. Processing at step 622 selects fault propagation paths from the site of the fault to a primary output. In the circuit of FIG. 6(c), signal lines 643, 650, 652, 654 and 655 are selected as fault propagation paths.

In the processing from steps 623-627, signals are allocated to each signal line on the propagation path. Signals to data signal lines express the effects of the fault which is indicated by a 0 or a 1; signals to control signal lines express the effects of the faults by the presence of or lack of presence of rise or fall signals; and, they are made unjustified signal lines.

Processing at step 623 examines whether there are any unprocessed faults on fault propagation path p. A branch is made to step 624 if there are unprocessed signal lines or to step 628 if there are no unprocessed signal lines.

The processing at step 624 selects a signal line s on the fault propagation path. At step 625 an examination is made whether signal line s is a data signal line or a control signal line. Processing branches to step 627 if the signal line s is a data signal line, or to step 626 if it is a control signal line.

In processing at step 626, a signal representing the effects of the fault by the presence or the lack of presence of rise or fall is allocated to the signal line s, and s is made an unjustified signal line.

At 627, a signal representing the effects of the fault which is indicated by a 0 or a 1, and s is made an unjustified signal line.

In the processing at steps 623-627, signals representing the effects of the fault which is indicated by a 0 or a 1 are allocated to the signal lines 643, 650 and 655 on the fault propagation path, and, signals representing the effects of the fault by the presence or lack of presence of the rise signal are allocated to signal lines 652 and 654. For example, if 656 was a 1 degeneration fault, the allocated signals would be; 0 to 643 if normal and 1 if there is a fault, 1 to 650 if normal and 0 if there is a fault, fall signal to 652 if normal and 1 if there is a fault, and, 1 to 655 if normal and 0 if there is a fault.

In the processing at step 628, a test sequence is generated for the purpose of sensitizing fault propagation paths. In the circuit of FIG. 6(c), the fault propagation paths are sensitized in the following manner. 1−v(t) signifies that at time frame t, a value v is allocated to the signal line 1. To represent value v, four expressions: 0, 1, P(rise) and N(fall) are used. To represent the effects of the fault, the normal value and the fault value are delimited by "/". For example, in order to represent effects of a fault, where the normal value is 1 and 0 when the fault exists, 1/0 is used.

In order to justify 655−1/0 (0):
654−P/1 (0)
655−0 (−1)
653−1 (−1)
In order to justify 654−P/1 (0):
652−N/0 (0)
649−1 (0) [Primary Input]
In order to justify 652−N/0 (0):
651−P (0)
652−1/0 (−1)
650−0 (−1)
In order to justify 651−P (0):
645−N (0) [Primary Input]
646−1 (0) [Primary Input]
In order to justify 652−1/0 (−1):
651−P (−1)
650−1/0 (−2)
In order to justify 651−P (−1):
645−N (−1) [Primary Input]
646−1 (−1) [Primary Input]
In order to justify 650−0 (−1):
643−1 (−1) [Primary Input]
644−1 (−1) [Primary Input]
In order to justify 653−1 (−1):
647−0 (−1) [Primary Input]
In order to justify 655−0 (−1):
654−1 (−1)
655−0 (−2)
In order to justify 654−1 (−1):
649−0 (−1)
In order to justify 650−1/0 (−2):
643−0 (−2) [Primary Input]
644−1 (−2) [Primary Input]
In order to justify 655−0 (−2):
654−P (−2)
653−0 (−3)
In order to justify 654−P (−2):

652—N (−2)
649—1 (−2)
In order to justify 652—N (−2):
651—P (−2)
652—1 (−3)
650—0 (−3)
In order to justify 651—P (−2):
645—N (−2) [Primary Input]
646—1 (−2) [Primary Input]
In order to justify 650—0 (−3):
643—1 (−3) [Primary Input]
644—1 (−3) [primary Input]
In order to justify 652—1 (−3):
651—P (−3)
650—1 (−4)
In order to justify 651—P (−3):
645—N (−3) [Primary Input]
646—1 (−3) [Primary Input]
In order to justify 650—1 (−4):
644—0 (−4) [Primary Input]

In the processing at step 629, test sequence generation is undertaken for the purpose of state initialization. In the circuit of FIG. 6(c), at the point in time when the processing for propagation path sensitization was completed, there are no unjustified signal lines so that state initialization is not necessary.

In accordance with this method, it is possible to allocate the effects of a fault represented by the presence or lack of presence of rise or fall signals only to the control input of the combinational circuit. Thus, the situation where the effects of a fault entered the control input of the memory element, which in the prior art required two or more time frames to be considered simultaneously, can be expressed in a single time frame which is advantageous from the standpoints of the amount of memory required and computational time.

Embodiment 7

The method of test sequence generation in embodiment 7 is one which, in prior processing, examines the operation of the memory element's control input, and allocates values accordingly.

FIGS. 7(a) and (b) are flow chart diagrams showing the method of test sequence generation of embodiment 7. FIG. 7(c) is a circuit diagram used to explain the method of test sequence generation of embodiment 7. In FIG. 7(c), 741 and 742 are D flip-flops, 743 and 744 are T flip-flops, 745-747 are primary inputs, 748-752 are signal lines, and, 753 is the primary output.

The method of test sequence generation of the subject embodiment will be explained using FIGS. 7(a)–(c).

In the processing at steps 702-706, the control input of each memory element is examined to determine whether a cyclical event can be generated by allocating an event to the primary input. The results of the examination are then stored. Subsequently, in the processing at steps 707-709, test sequences are generated for each fault.

Processing commences at step 701. At step 702, a check is made to determine whether there are any unprocessed control inputs of memory elements. If there are unprocessed control inputs of memory elements, the processing moves to step 703. If there are no unprocessed control inputs of memory elements, the move is to step 707.

In the processing at step 703, control input c of a memory element is selected. In FIG. 7(c), for example, 749 is selected.

The processing at step 704 examines whether a cyclical event can be generated at c by assigning an event to a primary input. In FIG. 7(c), it is found that, after applying a reset signal to 747, if a rise signal having a relative time frame of 0 within the cycle and with a cycle of 2 is applied to 746, that is a clock signal which rises at even time frames, it is possible to generate at 749 a fall signal with a cycle of 8 having a relative time frame of 4, that is, a signal which falls at the time frame where the remainder will be 4 when the time frame is divided by 8.

The processing at step 705 depends on whether generation was possible in the processing at step 704. A branch is made to step 706, if it was possible, or to step 702 if it was not possible. In FIG. 7(c), this was possible, so the branch is made to step 706.

In processing at step 706, the relationship between the event at a primary input and the cyclical event at c is stored. In FIG. 7(c), the information is stored so that, (after applying a reset signal to 747,) a signal which rises at a relative time frame of 0 within the cycle with a cycle of 2 is applied to 746, a signal which falls at a relative time frame of 4 with a cycle of 8 is generated at 749.

The location for storing the data from step 706 can be anywhere, provided that it can be recalled by the test sequence generation; in the main memory of the computer for example. Next, since there are unprocessed memory element control inputs, processing branches to step 703.

At step 703, if the memory element's control input signal line 746 was selected, since 746 is also a primary input, it can be seen that in the processing at step 704 a cyclical event can be freely generated at the primary input signal line 746. Accordingly, in the processing at step 705, the move is to step 706. At this time, since data has been stored by assigning an event to 746, a cyclical event can be generated at 749. At step 706 data is stored so that it is possible to apply a rise signal having a relative time frame of 0 within the cycle and with a cycle of 2 to 746, in order to generate a rise signal having a relative time frame of 0 and with a cycle of 2 in the same signal line 746. Next, since there is no unprocessed memory element control input, a branch is made to 707.

The processing at step 707 examines whether there are any unprocessed faults. A branch is made to step 708 if there are unprocessed faults, or to step 710 if there are no unprocessed faults and all processing is terminated.

At step 708, an unprocessed fault f is selected. For example, in FIG. 7(c), the degeneration fault 755 of signal line 751 is selected.

At step 709, test sequence generation is undertaken for the fault f selected in step 708.

FIG. 7(b) is a flow chart diagram explaining in detail the generation of test sequence for each fault.

Processing commences at step 721. In the processing at step 722, a fault propagation path from the site of the fault to a primary output is selected and effects of the fault are allocated to the signal lines on the path. In FIG. 7(c), the path will be 751, 752 and 753, and are allocated, respectively, effects of the fault which are 1 in normal state and 0 in the fault state. Since allocated effects of the fault are not justified, 751, 752 and 753 will be unjustified signal lines.

In the processing at step 723, the time frame when the effects of the fault reaches the primary output is set as the current time frame.

In FIG. 7(c), as an example, the current time frame is set to 0.

Subsequently, by moving back the current time frames, the processing at steps 724–734 are undertaken until there are no unjustified signal lines.

Processing at step 724 examines whether there are any unjustified signal lines. A branch is made to step 725 if there are unjustified signal lines; if there are none, the branch is made to step 735 and test sequence generation is completed.

In processing at step 725, by justifying signal lines within the current time frame, fault propagation or state initialization takes place. In FIG. 7(c), since 753 can transmit the state of the D flip-flop 742 to a primary output without allocating values to other signal lines, the propagation path is sensitized at the time frame when the effects of the fault pass through 753.

Examination takes place at step 726 to determine the values to be allocated to the input and output of the memory element in order to justify the output of the memory element. In FIG. 7(c), the values to be allocated in order to justify the state of 753 are examined. As a result, it is seen that the effects of the fault should be set at 752 and a fall signal be allocated to 749.

Processing at step 727 examines whether there are any allocations to the control input. If there are allocations to the control input, a branch is made to step 728, or to step 729 if there are no allocations. In the case of FIG. 7(c), allocations are required for control input 749 of the memory element so the branch is made to step 728.

Processing at step 728 examines whether prior processing had provided a method of generating a cyclical event. If there is such data, a branch is made to step 730, and to step 729 if there is not. In FIG. 7(c), there is data obtained in prior processing so the branch is to step 730.

In the processing at step 729, events are allocated in accordance with circuit data using prior art methods.

In the processing at step 730, events are allocated according to data from prior processing. In FIG. 7(c), after applying a reset signal to 747, it is known that it is possible to apply to 749 a fall signal having a relative time frame of 4 with a cycle of 8 so a fall signal is allocated to 749.

In order to justify this, in the subsequent time frames via the processing at step 725, assignments are made to 746 of rise signals at time frames 0, −2 and −4 and fall signals at time frames −1 and −3; 747 is set to 0 at a random time frame prior to time frame −5, and to 1 in time frames before that time frame.

In the processing of step 731, examination is made in step 732 as to whether the memory element's state has been justified. A branch is made to step 734 if justified, or to step 733 if unjustified. In FIG. 7(c), the effects of the fault at 753 have been justified so the branch is made to step 734.

In the processing at step 733, after backtracking, the branch is made to step 731.

In the processing at step 734, the time frame is set back one time frame and a branch is made to step 724. In FIG. 7(c), the time frame is set to −1 and a branch is made to step 724.

In FIG. 7(c), at the time frame −1, the signal line 752 is justified. In the processing at 725, the fault propagation path 752 can be sensitized.

It is found in processing at step 726 that a rise signal should be allocated to 746. Subsequently a branch is made to step 730 via processing at steps 727 and 728.

In the processing at step 730, in accordance with the data that a rise signal having a relative cycle of 0 within the cycle and with a cycle of 2 is to be allocated to 746, a rise signal is allocated at time frame −2. Since the effects of the fault at 752 is justified as the result of this, a branch is made from step 732 to step 734 and the time frame is moved back by one more time frame.

At time frame −3, by allocating 1 to 745 and 1 to 750 in the processing at step 725, the fault propagation path is sensitized.

Since it is seen from the processing at step 726 that in order to justify the state of the memory element's output 750, it is sufficient to allocate a fall signal to 749, processing proceeds to step 727, and to step 728 and branches to step 730 where a fall signal is allocated to 749 at event time frame −8. In order to justify this, in the subsequent time frames through processing at step 725, an assignment is made to 746 of rise signals at time frames −8, −10 and −12, and fall signals at time frames −9 and −11; 747 is made 0 at a random time frame prior to time frame −13, and 1 at time frames before that time frame.

At time frame −9, in the processing at step 725, it is possible to undertake the process within the state initialization time frame of setting 752 to 0 without allocating values to other signal lines.

At step 726, it is seen that in order to justify 0 for 752, it is sufficient to allocate 0 to 751 and rise signal to 746. Subsequently, the branch is made to step 730, via steps 727 and 728.

In the processing at step 730, a rise signal is allocated at time frame −10 in accordance with data from prior processing.

At time frame −11, 0 is allocated to 745 in order to set 0 at 751 in accordance with the processing at step 725.

At step 726, there are no unjustified memory element outputs so that the branch is made to step 729 from step 727.

At step 729, there are no events to allocate so nothing is done, and the branch is made to step 731.

At step 731, there are no memory element outputs to be justified so nothing is done, and the branch is made to step 734 from step 732.

After progressing to time frame −12, only signal line 747 remains as an unjustified signal line. Therefore, at time frame −13, 747 is made 0 through processing at step 725.

At time frame −14, 747 is made 1 through processing at step 725.

Through the above processing, the following test sequence was obtained:

Time frame −14: 1 to 747
Time frame −13: 0 to 747
Time frame −12: Rise to 746
Time frame −11: Fall to 746
Time frame −11: 0 to 745
Time frame −10: Rise to 746
Time frame −9: Fall to 746
Time frame −8: Rise to 746
Time frame −7: Fall to 746
Time frame −6: Rise to 746
Time frame −5: Fall to 746
Time frame −4: Rise to 746
Time frame −3: Fall to 746
Time frame −3: 1 to 745
Time frame −2: Rise to 746
Time frame −1: Fall to 746

Time frame 0: Rise to 746

In this manner, in the method of test sequence generation of the subject embodiment, a test sequence can be generated efficiently even for circuits having complex clock structure.

Embodiment 8

The method of test sequence generation of embodiment 8 is characterized by the utilization of data regarding tree circuits obtained in prior processing.

FIGS. 8(a) and 8(b) are flow chart diagrams showing the method of test sequence generation of embodiment 8. FIG. 8(c) is a circuit diagram used for explaining the method of test sequence generation of embodiment 8. 841-845 are branch signal lines, 846 and 847 are signal lines, and, 848 is a tree circuit.

Processing at steps 802-806 in FIG. 8(a) considers that for each branching point the branching point itself is an output; and the branching signal line on the input side, or a primary input, or a pseudo primary input is an input. A tree circuit without internal branching points is extracted and the combination of inputs for the tree circuit which will apply 0 and 1 to the tree circuit's output is examined and stored. In the processing at steps 807-809, a test sequence is generated for each fault using the data on the tree circuit obtained in prior processing.

In generating a test sequence for sequential circuits, the process of sensitizing the fault propagation path from the site of the fault to the primary output, and that of state initialization to cause the transition from the initial state to a state capable of generating the effects of the fault are undertaken.

In either case, the first step is to obtain an initial target to indicate what values should be allocated to which signal line. To obtain the primary input and pseudo primary input to satisfy the initial target, as well as the combination of values to allocate to same, a process called backward hunt is undertaken. This is a processing to propagate the target sequentially backwards from the initial target. From the results of backward hunt, values are allocated to the primary input or the pseudo primary input. If inconsistencies occurred as the result of allocating values to the primary input or the pseudo primary input, values are reallocated using a process known as backtracking.

The combination of inputs for the tree circuit to allocate 0 and 1 to the tree circuit's output can be obtained without backtracking. Since in the subject embodiment, by the use of these results, it is possible to propagate the target from the tree circuit's output to the input during backward hunt without propagating the target to each element, the processing can be expedited.

FIGS. 8(a) and 8(b) will be used to explain in detail the method of test sequence generation of the subject embodiment.

Processing commences at step 801. At step 802, a check is made whether there are any unprocessed branching points. A branch is made to step 803 if there are unprocessed branching points, or to 807 if there are none.

In processing at step 803, an unprocessed branching point s is selected. In FIG. 8(c), it will be assumed that the branch signal line 841 was selected.

Next, in processing at step 804, the input side is examined from the branching point s, branching point s is made the output; and, the branching point or the primary input or the pseudo primary input is made the input and tree circuit FFR, which has no internal branching points, is extracted. In the case of FIG. 8(c), 848 would be extracted.

In processing at step 805, the combination of inputs for the tree circuit FFR to make the branching points be 0 is obtained and stored. In FIG. 8(c), as the input combination for the tree circuit 848 to make 841 be 0, the combination of 0 for 842 and 0 for 845 is stored.

In processing at 806, the combination of outputs for the tree circuit FFR which would make the branching point s to be 1 is obtained and stored. In the case of FIG. 8(c), as the input combination for the tree circuit 848 to make 841 be 1, the combination of 1 for 844 and 1 for 845 are stored.

For the processing at steps 805 and 806, the location for storing this data can be anywhere that can be read when generating the test sequence and, for example, can be stored in the computer's main memory. Also, it makes no difference whether the processing at steps 805 and 806 is done in reverse sequence.

Processing at step 807 examines whether there are any unprocessed faults. If there are unprocessed faults, processing branches to step 808. If there are no more unprocessed faults, the branch is to step 810 and all processing is completed. At step 808, an unprocessed fault f is selected. In the processing at step 809, utilizing data for the tree circuit obtained in prior processing, a test sequence for the unprocessed fault f is generated.

FIG. 8(b) is a flow chart diagram showing the test sequence generation at step 809 which utilizes data on the tree circuit obtained in prior processing.

Processing commences at step 821. The processing at step 822 utilizes measures such as observability cost to select a fault propagation path from the site of the fault to a primary output and allocates the effects of the fault.

In processing at step 823, the current time frame is set at the time frame when the effects of the fault reach a primary output.

At step 824, an examination is made whether there are any unjustified signal lines. A branch is made to step 825 if there are unjustified signal lines. If there are no unjustified signal lines, a branch is made to step 837 and test sequence generation is completed.

At step 825, an initial target is set in order to sensitize the fault propagation path or initialize the state in the current time frame by allocating which values to which signal line. Until all fault propagation paths from the site of the fault to a primary output are justified, the process of sensitizing fault propagation paths is continued; and, after justification, state initialization is conducted until the state of the circuit has been returned to the initial state.

In the backward hunt, for the purpose of sequentially propagating backwards a plurality of targets, two sets; current target group and final target group are used. The current target group is used to temporarily store the target in the process of propagation, and the final target group is used to store the combination for allocating values. In the processing at step 826, the current target group and the final target group are blanked.

In the processing at steps 825 and 826, either can be processed first. In processing at step 827, the initial target group determined by processing at 825 is entered in the current target group.

Next, as long as the current target group is not blank, the processing at steps 828-832 is repeated. In case the current target group is not blank, processing branches to step 829. If the current target group is blank, the branch is to processing at 833.

In the processing at step 829, one target (s, v) is extracted from the current target group. Here, s is the target signal line and v is the value which should be allocated to the target signal line s.

In processing at step 830, examination takes place whether the target signal line s is a branch signal line. Processing branches to step 831 if the target signal line s is a branch signal line, or, to step 832 if not a branch signal line.

In processing at step 831, the next target is obtained in accordance with data on the tree circuit obtained from prior processing. For instance, for a target which makes 841 be 1, two targets; 1 for 844 and 1 for 845, as obtained in prior processing, are obtained as the next targets.

When the next targets thus obtained are primary inputs or pseudo primary inputs, the next targets thus obtained are entered in the final target group; all others are entered in the current target group.

In processing at step 832, the next target is obtained in accordance with circuit data. If the next target thus obtained is a primary input or a pseudo primary input, the next target to be obtained will be entered in the final target group; all others are entered in the current target group.

In processing at step 833, values are allocated in accordance with the targets stored in the final target group.

In processing at step 834, an examination takes place to determine whether inconsistencies were generated by the processing at step 833. If no inconsistencies occurred, processing proceeds to step 835; if inconsistences occurred, processing proceeds to step 836.

In processing at step 835, the time frame is moved back by one and processing proceeds to step 824.

In processing at step 836, since inconsistencies occurred because the value allocations were inappropriate, backtracking is undertaken and values are reallocated. A branch is made to step 834 thereafter and the backtracking of step 836 will be repeated until there are no more inconsistences.

In accordance with the method of the subject embodiment, when undertaking test sequence generation for each fault, results of this prior processing can be used for each backward hunt so that test sequence generation can be expedited.

As related above, the methods of test sequence generation in the subject invention solve the many inherent problems in the prior art test sequence generation for sequential circuits, and, have the effect of efficiently generating test sequences with high fault detection rates.

What is claimed is:

1. A computer implemented method of generating a test input sequence and corresponding output values for a fault in a logic circuit, said logic circuit having input terminals, output terminals and including sequential and combinational portions, said method comprising the steps of:

generating the test input sequence representing input values to said logic circuit, the input values being designed to cause a signal indicating the fault to be propagated to the sequential portion of the logic circuit;

simulating a response of the logic circuit to the test input sequence and simulating storage of the fault indication signal in the sequential portion of the logic circuit as one of a group of simulated state values which define a state of the sequential portion of the logic circuit;

storing the simulated state values of the sequential portion of the logic circuit;

setting a time limit defining a time interval;

determining the end of said time interval;

providing the stored state values of said sequential portion of said logic circuit as output values if the fault indication signal has not been propagated to one of the output terminals of the logic circuit during the time interval.

2. A computer implemented method of generating a test sequence of a fault within a sequential circuit that includes a plurality of primary input terminals, a plurality of primary output terminals, a combinational circuit and a plurality of memory elements, wherein input terminals of the memory elements are defined as respective pseudo primary output terminals and output terminals of the memory elements are defined as respective pseudo primary input terminals, wherein a first time frame is assigned for signal propagation to the input terminal of each of the memory elements and to the combinational circuit and a second time frame is assigned for signal propagation from the output terminal of each of the memory elements, said first time frame being earlier than said second time frame, said method comprising the steps of:

generating a test pattern for the combinational circuit wherein input values are applied to the primary input terminals and the pseudo primary input terminals and output values are provided at the primary output terminals and the pseudo primary output terminals;

storing the respective input values which are applied to the pseudo primary input terminals in the process of generating the test pattern, and storing the respective output values provided by all pseudo primary output terminals which exhibit effects of the fault before any of the primary output terminals exhibit effects of the fault;

setting a time limit for generating the test sequence for the sequential circuit;

generating the test sequence for the fault as a sequence of the further test patterns resulting from the test pattern; and if the step of generating the test sequence has not been aborted for exceeding the time limit, providing, as an output, the test sequence generated in the step of generating the test sequence;

if the step of generating the test sequence has been aborted for exceeding the time limit, providing as an output, the stored pseudo primary input values and the stored pseudo primary output values responsive to the pseudo primary output values having been stored.

3. A computer implemented method of generating a test sequence for a fault within a sequential circuit that includes a plurality of primary input terminals, a plurality of primary output terminals, a combinational circuit and a plurality of memory elements, wherein input terminals of the memory elements are defined as respective pseudo primary output terminals and output terminals of the memory elements are defined as respective pseudo primary input terminals, wherein a first time frame is assigned for signal propagation to the input terminal of each of the memory elements and to the combinational circuit and a second time frame is assigned for signal propagation from the output terminal of each of the memory elements, said first time frame being earlier than said second time frame, said method comprising the steps of:

a) generating a first test pattern for a first fault assumed at a first pseudo primary input terminal;

b) simulating a response of the sequential circuit with the first fault to the first test pattern;

C) classifying the first pseudo primary input terminal according to the simulated response including the steps of:

C1) classifying said first pseudo primary input terminal as Class 0 if a signal state indicating the first fault failed to be propagated to a primary output terminal or to a pseudo primary output terminal;

C2) classifying said first pseudo primary input terminal as Class 2 if a signal state indicating the first fault is propagated to a primary output terminal, and storing the first test pattern; and C3) classifying said first pseudo primary input terminal as Class 1 if a signal state indicating the first fault fails to be propagated to one of said primary output terminals but is propagated to a first one of said pseudo primary output terminals, defined as the input terminal of a corresponding first one of said memory elements, wherein effects of the first fault are propagated to a second one of said pseudo primary input terminals, which is defined for the output terminal of the first memory element by: classifying the second pseudo primary input terminal according to step C), assigning a first plurality of values to other ones of said pseudo primary output terminals and assigning a first signal state to the second pseudo primary input terminal, wherein the second pseudo primary input terminal has been classified class 1 or class 2, storing: the first test pattern, the first plurality of values assigned to the ones of said pseudo primary output terminals and the first signal state assigned to the second pseudo primary input terminal;

D) generating a second test pattern for a second fault;

E) simulating a response of the sequential circuit with the second fault to the second test pattern;

F) if a signal state indicating the second fault fails to be propagated to one of said primary output terminals but is propagated to a second one of said pseudo primary output terminals, defined as the input terminal of a corresponding second one of said memory elements, wherein effects of the second fault are propagated to a third one of said pseudo primary input terminals, which is defined for the output terminal of the second memory element, by assigning a second plurality of values to other ones of said pseudo primary output terminals and assigning a second signal state to the third pseudo primary input terminal, and storing: the second test pattern, the second plurality of values assigned to the ones of said pseudo primary output terminals and the second signal state assigned to the third pseudo primary input terminal;

G) classifying the third pseudo primary input terminal according to step C);

H) if the third pseudo primary input terminal has been classified Class 2, performing the steps of:

H1) identifying inconsistencies within the second test pattern, the second plurality of values assigned to the ones of said pseudo primary input terminals, the second signal state assigned to the third pseudo primary input terminal and the first test pattern obtained in the process of classifying the third pseudo primary input terminal as Class 2;

H2) assigning a second plurality of values to the other ones of said pseudo primary output terminals to cause effects of the second fault to be propagated to the third pseudo primary input terminal if no inconsistencies are identified, wherein said second plurality of values are defined as unjustified signal lines;

H3) assigning said first test pattern to the primary input terminals and the pseudo primary input terminals;

H4) defining the pseudo primary input terminals to which values of 0 or 1 are assigned as a part of the first test pattern as unjustified signal lines;

H5) generating a test input sequence by sequentially justifying said unjustified signal lines according to the order of occurrence of their respective assigned time frames; and I) providing the test input sequence as the test sequence for the second fault.

4. A computer implemented method of generating a test sequence for a fault within a sequential circuit that includes a plurality of primary input terminals, a plurality of primary output terminals, a combinational circuit and a plurality of memory elements, wherein input terminals of the memory elements are defined as respective pseudo primary output terminals and output terminals of the memory elements are defined as respective pseudo primary input terminals, wherein a first time frame is assigned for signal propagation to the input terminal of each of the memory elements and to the combinational circuit and a second time frame is assigned for signal propagation from the output terminal of each of the memory elements, said first time frame being earlier than said second time frame, said method comprising the steps of:

A) generating a first test pattern for a first fault assumed at a first pseudo primary input terminal;

B) simulating a response of the sequential circuit with the first fault to the first test pattern;

C) classifying the first pseudo primary input terminal according to the simulated response including the steps of:

C1) classifying said first pseudo primary input terminal Class 0 if a signal state indicating the first fault failed to be propagated to a primary output terminal or a pseudo primary output terminal;

C2) classifying said first pseudo primary input terminal as Class 2 if a signal state indicating the first fault is propagated to a primary output terminal, and storing the first test pattern;

C3) classifying said first pseudo primary input terminal as class 1 if a signal state indicating the first fault fails to be propagated to one of said primary output terminals but is propagated to a first one of said pseudo primary output terminals, defined as the input terminal of a corresponding first one of said memory elements, wherein effects of the first fault are propagated to a second one of said pseudo primary input terminals, which is defined for the output terminal of the first memory element, by: classifying the second pseudo primary input terminal according to step C), assigning a first plurality of values to other ones of the pseudo primary output terminals and assigning a first signal state to the second pseudo primary input terminal, wherein the second pseudo primary input terminal has been classified as class 1 or class 2, storing: the first test pattern, the first plurality of values assigned to the ones of said pseudo primary output terminals and the first signal state assigned to the second pseudo primary input terminal;

D) generating a second test pattern for a second fault;

E) simulating a response of the sequential circuit with the second fault to the second test pattern;

F) if a signal state indicating the second fault fails to be propagated to one of said primary output terminals but is propagated to a second one of said pseudo primary output terminals, defined as the input terminal of a corresponding second one of said memory elements, wherein effects of the second fault are propagated to a third one of said pseudo primary input terminals, which is defined for the output terminal of the second memory element, by assigning a second plurality of values to other ones of said pseudo primary output terminals and assigning a second signal state to the third pseudo primary input terminal, and storing as a set: the second test pattern, the second plurality of values assigned to the ones of said pseudo primary output terminals and the second signal state assigned to the third pseudo primary input terminal;

G) classifying the third pseudo primary input terminal according to step C);

H) if the third pseudo primary input terminal has been classified Class 1, performing the steps of:

H1) identifying inconsistencies within the second test pattern, the second plurality of values assigned to the ones of said pseudo primary input terminals, the second signal state assigned to the third pseudo primary input terminal and the first test pattern obtained in the process of classifying the third pseudo primary input terminal as Class 1;

H2) entering into the set, the first test pattern stored in the step of classifying the third pseudo primary input terminal, the values assigned to the pseudo primary output terminals and the signal state assigned to the second pseudo primary input terminal for the purpose of propagating the effects of the second fault to the third pseudo primary input terminal;

H3) assigning the values entered into said set to the primary input terminals, the pseudo primary input terminals and the pseudo primary output terminals;

H4) defining the pseudo primary input terminals to which values of 0 or 1 are assigned as a part of the first test pattern and the pseudo primary output terminals to which values of 0 or 1 are assigned as a part of the first test pattern as unjustified signal lines;

H5) generating a test input sequence by sequentially justifying said unjustified signal lines according to the order of occurrence of their respective assigned time frames; and I) providing the test input sequence as the test sequence for the second fault.

5. A computer implemented method of generating a test sequence for a fault within a sequential circuit that includes a plurality of primary input terminals, a plurality of primary output terminals, a combinational circuit and a plurality of memory elements, wherein input terminals of the memory elements are defined as respective pseudo primary output terminals and output terminals of the memory elements are defined as respective pseudo primary input terminals, and interconnections in the combinational circuit and between the combinational circuit and the memory elements are defined as signal lines, each of said signal lines having an input side coupled to output terminals of circuit elements of said sequential circuit and an output side coupled to input terminals of circuit elements of said sequential circuit, said method comprising the steps of:

assigning controllability costs to each signal line in the sequential circuit, wherein a 0 controllability cost assigned to one of the signal lines represents a measure of difficulty of controlling the signal line to have a value of 0, a 1 controllability cost assigned to the signal line represents a measure of difficulty of controlling the signal line to have a value of 1, a P controllability cost assigned to the signal line represents a measure of difficulty of controlling the signal line to exhibit a positive-going transition and an N controllability cost assigned to the signal line represents a measure of difficulty of controlling the signal line to exhibit a negative-going transition; and selecting, as the test sequence, a plurality of values for the input side of each of a respective plurality of the signal lines, in order to set the state of each of said plurality of signal lines within the sequential circuit, wherein, if there is freedom of selection in assigning values to the input sides of said plurality of signal lines, the values are selected to form a combination of possible assigned values having a summed controllability cost which is less than all other summed controllability costs for all other possible combinations of values, respectively.

6. A computer implemented method of generating a test sequence for a fault within a sequential circuit that includes a plurality of primary input terminals, a plurality of primary output terminals, a combinational circuit and a plurality of memory elements, wherein input terminals of the memory elements are defined as respective pseudo primary output terminals of the sequential circuit and output terminals of the memory elements are defined as respective pseudo primary input terminals of the sequential circuit, wherein a first time frame is assigned for signal propagation to the input terminal of each of the memory elements and to the combinational circuit and a second time frame is assigned for signal propagation from the output terminal of each of the memory elements, said first time frame being earlier than said second time frame, and wherein interconnections in the combinational circuit and between the combinational circuit and the memory elements are defined as signal lines, each of said signal lines having an input side coupled to output terminals of circuit elements of said sequential circuit and an output side coupled to input terminals of circuit elements of said sequential circuit, said method comprising the steps of:

computing a controllability cost for each signal line in the sequential circuit, wherein a 0 controllability cost assigned to one of the signal lines represents a measure of difficulty of controlling the one signal line to have a state of 0, a 1 controllability cost represents a measure of difficult of controlling the one signal line to have a state of 1, a P controllability cost represents a measure of difficulty of causing the one signal line to exhibit a positive-going transition and an N controllability cost represents a measure of difficulty of causing the one signal line to exhibit a negative-going transition;

computing an observability cost for each signal line within the sequential circuit, the observability cost for a signal line representing a measure of difficulty of observing the value exhibited by the signal line at a primary output terminal, based on the four types of controllability costs;

selecting the test sequence for the fault such that a fault propagation path for the fault to one of the primary output terminals is selected such that the selected path has a summed observability cost which is lower than all other summed observability for all other respective possible propagation paths for the fault to one of the primary output terminals.

7. A computer implemented method of generating a test sequence for a fault within a sequential circuit that includes a plurality of primary input terminals, a plurality of primary output terminals, a combinational circuit and a plurality of memory elements, wherein input terminals of the memory elements are defined as respective pseudo primary output terminals of the sequential circuit and output terminals of the memory elements are defined as respective pseudo primary input terminals of the sequential circuit, wherein a first time frame is assigned for signal propagation to the input terminal of each of the memory elements and to the combinational circuit and a second time frame is assigned for signal propagation from the output terminal of each of the memory elements, said first time frame being earlier than said second time frame, and wherein interconnections in the combinational circuit and between the combinational circuit and the memory elements are defined as signal lines, each of said signal lines having an input side coupled to output terminals of circuit elements of said sequential circuit and an output side coupled to input terminals of circuit elements of said sequential circuit, said method comprising the steps of:

identifying, as data input signal lines, the signal lines within the combinational circuit which have respective signal propagation paths that reach a primary output terminal or a pseudo primary output terminal and identifying all other signal lines as control signal lines;

storing identifiers representing the data input signal lines and the control signal lines;

determining fault propagation paths for given faults in the sequential circuit;

assigning values to signal lines on the fault propagation path, wherein, for data signal lines values are assigned according to a combination of 1 when normal and 0 when in a fault state or, 0 when normal and 1 when in a fault state, and for control signal lines values are assigned as a combination of having a rise or a fall signal when normal and having a substantially constant signal when in a fault state or having substantially constant signal when normal and having a rise or a fall signal when in a fault state;

marking all signal lines, other than primary output terminals, to which values have been assigned as unjustified signal lines; and, generating the test sequence by sequentially justifying the unjustified signal lines according to the order of occurrence of their respective signal propagation time frames.

8. A computer implemented method of generating a test sequence for a fault within a sequential circuit that includes a plurality of primary input terminals, a plurality of primary output terminals, a combinational circuit and a plurality of memory elements each having an input terminal, an output terminal and a control terminal, said method comprising the steps of:

determining if one of a plurality of cyclical events is generated at the control terminal of each memory element in the sequential circuit by applying, to selected ones of the primary input terminals, respective values calculated to generate the one of said cyclical events to;

relationally storing data representing the respective values applied at the selected primary input terminals with data represented the generated cyclical event for each control input terminal of each memory element for which it was determined that one of the plurality of cyclical events is generated; and assigning values, as the test sequence, to the primary input terminals in accordance with the relationally stored data to cause respective values to be assigned to each of the related control terminals of the memory elements.

9. A computer implemented method of generating a test sequence for an assumed fault within a sequential circuit that includes a plurality of primary input terminals, a plurality of primary output terminals, a combinational circuit and a plurality of memory elements, wherein input terminals of the memory elements are defined as respective pseudo primary output terminals of the sequential circuit and output terminals of the memory elements are defined as respective pseudo primary input terminals of the sequential circuit, wherein interconnection in the combinational circuit and between the combinational circuit and the memory elements are defined as signal lines, and ones of the signal lines exhibit branching points in which one input signal to the signal line is provided as multiple output signals from the signal line, said method comprising the steps of:

a) modifying the sequential circuit by defining each branching point of each signal line as a distinct output terminal and dividing the modified sequential circuit into a plurality of tree circuits having input signal lines and an output signal lines, and having internal signal lines without branching points;

b) storing, for each tree circuit, zero-forcing values to be assigned to the respective input signal lines to cause the output signal line of the tree circuit to exhibit a value of 0;

c) storing, for each tree circuit, one-forcing values to be assigned to the respective input signal lines to cause the output signal line of the tree circuit to exhibit a value of 1;

d) defining one of the signal lines of the sequential circuit to be a target signal line and assigning a target value to the target signal line, wherein said target signal line is selected to cause an indication of the assumed fault to be propagated to at least one of the primary output terminals and the pseudo primary output terminals;

e) setting values for other signal lines in the one of the tree circuits which includes the target signal line and for any of the primary input terminals and the pseudo primary input terminals which is coupled to the input terminals of the one tree circuit by analyzing signal lines sequentially backward from the target signal line, propagating backwards a set of values consistent with the stored zero-forcing and one-forcing values for the one tree circuit;

f) repeating steps d) and e) until the indication of the assumed fault has been propagated to the one of the primary output terminals or pseudo primary output terminals.

* * * * *